US012813107B2

(12) United States Patent
Son et al.

(10) Patent No.: US 12,813,107 B2
(45) Date of Patent: Nov. 24, 2026

(54) DISPLAY DEVICE

(71) Applicant: Samsung Display Co., LTD., Yongin-si (KR)

(72) Inventors: Sun Kwun Son, Yongin-si (KR); Dong Hee Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 402 days.

(21) Appl. No.: 18/539,937

(22) Filed: Dec. 14, 2023

(65) Prior Publication Data

US 2024/0206264 A1 Jun. 20, 2024

(30) Foreign Application Priority Data

Dec. 19, 2022 (KR) ........................ 10-2022-0178629

(51) Int. Cl.

*H10K 59/131* (2023.01)
*H10K 59/121* (2023.01)
*H10K 59/88* (2023.01)

(52) U.S. Cl.

CPC ........... *H10K 59/131* (2023.02); *H10K 59/88* (2023.02); *H10K 59/1216* (2023.02)

(58) Field of Classification Search

CPC .. H10K 59/131; H10K 59/88; H10K 59/1216; H10K 59/1213; H10K 59/8052; H10D 86/441; H10H 29/49; H10H 20/857; G02F 1/136272; G02F 2201/506–508

See application file for complete search history.

(56) References Cited

U.S. PATENT DOCUMENTS

| | | | | |
|---|---|---|---|---|
| 10,553,663 B2 | 2/2020 | Choi et al. | | |
| 10,978,536 B2 | 4/2021 | Park et al. | | |
| 2012/0300165 A1* | 11/2012 | Zhuang | G09G 3/3648 445/2 | |
| 2015/0084014 A1* | 3/2015 | Kim | H10K 59/131 438/4 | |
| 2018/0331171 A1* | 11/2018 | Kim | H10K 50/828 | |
| 2020/0168686 A1 | 5/2020 | Han et al. | | |

FOREIGN PATENT DOCUMENTS

| | | |
|---|---|---|
| KR | 10-2018-0080741 A | 7/2018 |
| KR | 10-2020-0077677 A | 7/2020 |

* cited by examiner

*Primary Examiner* — Vincent Wall

(74) *Attorney, Agent, or Firm* — F. CHAU & ASSOCIATES, LLC

(57) ABSTRACT

A display device includes a pixel including first to third sub-pixels each including a storage capacitor and disposed adjacent to each other, a data wire electrically connected to the first to third sub-pixels, a first power wire supplying a voltage of a first driving power source to the first to third sub-pixels, and a dummy wire disposed to be spaced apart from the first power wire. The dummy wire includes a first dummy wire disposed between the storage capacitor of one of the first to third sub-pixels and the storage capacitor of an adjacent one of the first to third sub-pixels, and a second dummy wire disposed between the data wire and the storage capacitor of each of the first to third sub-pixels. The first power wire, the first dummy wire, and the second dummy wire are electrically connected to each other.

20 Claims, 11 Drawing Sheets

DISPLAY DEVICE

CROSS REFERENCE TO RELATED APPLICATION(S)

This application claims priority to and the benefits of Korean Patent Application No. 10-2022-0178629 under 35 U.S.C. § 119, filed on Dec. 19, 2022, in the Korean Intellectual Property Office (KIPO), the entire contents of which are incorporated herein by reference.

BACKGROUND

1. Technical Field

The disclosure relates to a display device.

2. Description of the Related Art

Recently, as interest in information display is increasing, research and development for display devices are continuously conducted.

SUMMARY

Embodiments may provide a display device with improved reliability.

According to an embodiment, a display device may include a pixel including a first sub-pixel, a second sub-pixel, and a third sub-pixel, each including a storage capacitor and disposed adjacent to each other, a data wire electrically connected to the first to third sub-pixels, a first power wire supplying a voltage of a first driving power source to the first to third sub-pixels, and a dummy wire disposed to be spaced apart from the first power wire. The dummy wire may include a first dummy wire disposed between the storage capacitor of one of the first to third sub-pixels and the storage capacitor of an adjacent one of the first to third sub-pixels, and a second dummy wire disposed between the data wire and the storage capacitor of each of the first to third sub-pixels. The first power wire, the first dummy wire, and the second dummy wire may be electrically connected to each other.

In an embodiment, the display device may further include a first insulating layer, a second insulating layer, a third insulating layer, and a fourth insulating layer sequentially disposed on a substrate. The first power wire may include a first vertical power wire configured of a first conductive layer disposed on the substrate and a first horizontal power wire configured of a second conductive layer disposed on the second insulating layer. The first horizontal power wire may extend in a first direction. The first vertical power wire may extend in a second direction intersecting the first direction. The first vertical power wire and the first horizontal power wire may be electrically connected to each other.

In an embodiment, the first dummy wire and the second dummy wire may be configured of the first conductive layer. The first vertical power wire, the first dummy wire, and the second dummy wire may be disposed on a same layer.

In an embodiment, the first vertical power wire, the first dummy wire, and the second dummy wire may be integral with each other.

In an embodiment, in a plan view, the first dummy wire may extend from the first vertical power wire in the first direction and connected to the second dummy wire. In a plan view, the second dummy wire may face the first vertical power wire with the first dummy wire between the first vertical power wire and the second dummy wire.

In an embodiment, the first vertical power wire, the first dummy wire, the second dummy wire may be connected to each other and form a mesh shape in a plan view.

In an embodiment, the dummy wire may be supplied with the voltage of the first driving power source.

In an embodiment, the first dummy wire may be disposed between the storage capacitor of the first sub-pixel and the storage capacitor of the third sub-pixel, and between the storage capacitor of the third sub-pixel and the storage capacitor of the second sub-pixel.

In an embodiment, the display device may further include a scan wire configured of the second conductive layer, extending in the first direction, and electrically connected to the first to third sub-pixels. The scan wire may include a sub-scan wire branched in the second direction. In a plan view, the sub-scan wire may be disposed between the second dummy wire and the storage capacitor of each of the first to third sub-pixels.

In an embodiment, the second dummy wire may be disposed between the sub-scan wire and the data wire.

In an embodiment, each of the first to third sub-pixels may include a pixel circuit layer including a first transistor, a second transistor, and a third transistor, and the storage capacitor electrically connected to the first to third transistors, and a display element layer disposed on the pixel circuit layer, electrically connected to the storage capacitor, and including a light emitting element emitting light.

In an embodiment, each of the first to third transistors may include an active pattern disposed on the first insulating layer; a gate electrode configured of the second conductive layer and overlapping the active pattern in a plan view; a source electrode connected to an end of the active pattern; and a drain electrode connected to another end of the active pattern.

In an embodiment, the light emitting element may include a first electrode disposed on the pixel circuit layer; a light emitting layer disposed on the first electrode; and a second electrode disposed on the light emitting layer.

In an embodiment, the first electrode may be configured of a third conductive layer disposed on the fourth insulating layer, and may be electrically connected to the storage capacitor through a contact portion penetrating the fourth insulating layer, the third insulating layer, and the second insulating layer.

In an embodiment, the storage capacitor may include a lower electrode configured of the first conductive layer; and an upper electrode disposed on the lower electrode with the first insulating layer between the lower electrode and the upper electrode. The first electrode may be electrically connected to the upper electrode through the contact portion.

In an embodiment, the display device may further include a second power wire supplying a voltage of a second driving power source different from the first driving power source to the first to third sub-pixels. The second power wire may include a second vertical power wire configured of the first conductive layer; and a second horizontal power wire configured of the second conductive layer. The second vertical power wire and the second horizontal power wire may be electrically connected to each other.

In an embodiment, the first horizontal power wire may include a first sub-wire and a second sub-wire spaced apart from each other in the first direction. The first sub-wire may be electrically connected to the first vertical power wire, and the second sub-wire may be electrically connected to the second dummy wire.

In an embodiment, the storage capacitor of another pixel disposed adjacent to the pixel in the second direction may extend to an area between the first sub-wire and the second sub-wire.

According to an embodiment, a display device may include pixels disposed on a substrate. Each of the pixels may include a first sub-pixel, a third sub-pixel, and a second sub-pixel, each including a storage capacitor and arranged in a vertical direction in a plan view, a first data wire electrically connected to the first sub-pixel, a second data wire electrically connected to the second sub-pixel and spaced apart from the first data wire in a horizontal direction in a plan view, a third data wire electrically connected to the third sub-pixel and spaced apart from the second data wire in the horizontal direction, a first power wire supplying a voltage of a first driving power source to the first to third sub-pixels, a second power wire supplying a voltage of a second driving power source to the first to third sub-pixels, a first dummy wire electrically connected to the first power wire and disposed between the storage capacitor of the first sub-pixel and the storage capacitor of the third sub-pixel, and between the storage capacitor of the third sub-pixel and the storage capacitor of the second sub-pixel, and a second dummy wire electrically connected to the first power wire and disposed between the first data wire and the storage capacitor of the first to third sub-pixels.

In an embodiment, the first power wire may include a first vertical power wire extending in the vertical direction, and a first horizontal power wire extending in the horizontal direction and electrically connected to the first vertical power wire. The first vertical power wire, the first dummy wire, the second dummy wire may be connected to each other and form a mesh shape in a plan view.

According to an embodiment, a first dummy wire electrically connected to a first vertical power wire may be disposed between storage capacitors of adjacent sub-pixels, and a second dummy wire electrically connected to the first vertical power wire may be disposed between a storage capacitor of each sub-pixel and a data wire, so that a display device with improved reliability may be provided by reducing parasitic capacitance of each sub-pixel.

Effects of the embodiment are not limited by what is illustrated in the above, and more various effects are included in the specification.

DETAILED DESCRIPTION OF THE EMBODIMENTS

Figure 1:
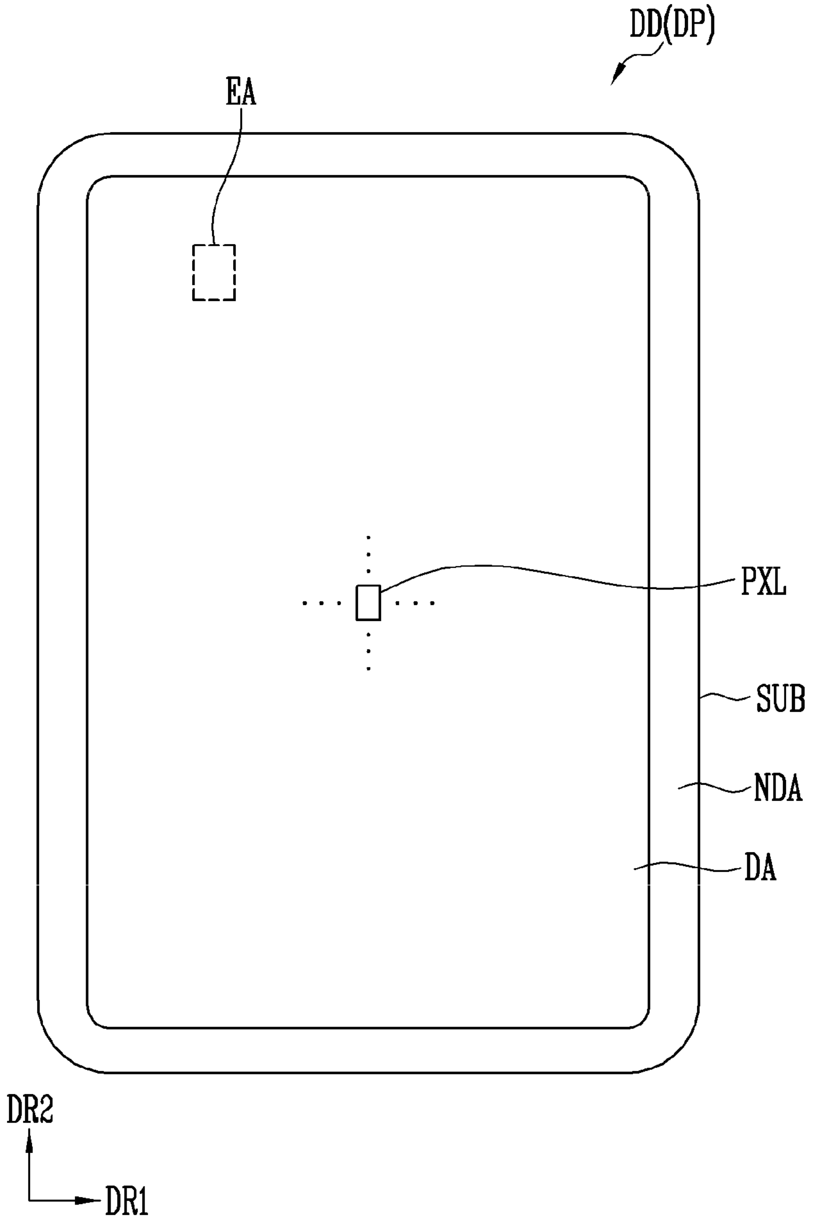
FIG. 1 is a schematic plan view of a display device according to an embodiment.

Since the disclosure may be variously modified and have various forms, embodiments will be illustrated and described in detail in the following. This, however, by no means restricts the disclosure to the specific embodiments, and it is to be understood as embracing all included in the scope of the disclosure changes, equivalents, and substitutes.

Like reference numerals are used for like constituent elements in describing each drawing. In the accompanying drawings, the dimensions of the structure are exaggerated and shown for clarity of the disclosure. Terms such as “first,” “second,” and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure.

In the application, it should be understood that the term “include”, “comprise”, “have”, or “configure” indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being “on” another element, it can be directly on the other element or intervening elements may also be present. In the specification, when an element of a layer, film, region, area, plate, or the like is referred to as being formed “on” another element, the formed direction is not limited to an upper direction but includes a lateral or lower direction. In contrast, when an element of a layer, film, region, area, plate, or the like is referred to as being “below” another element, it may be directly below the other element, or intervening elements may be present. Moreover, the terminology used herein is for the purpose of describing particular embodiments and is not intended to be limiting. As used herein, the singular forms, “a,” “an,” and “the” are intended to include the plural forms as well, unless the context clearly indicates otherwise.

Spatially relative terms, such as “beneath,” “below,” “under,” “lower,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the example term “below” can encompass both an orientation of above and below. Furthermore, the apparatus may be otherwise oriented (e.g., rotated 90 degrees or at other orientations), and, as such, the spatially relative descriptors used herein interpreted accordingly.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, with reference to accompanying drawings, embodiments of the disclosure and others required for those skilled in the art to understand the contents of the disclosure will be described in more detail. In the description below, singular forms are to include plural forms unless the context clearly indicates only the singular.

Figure 2:
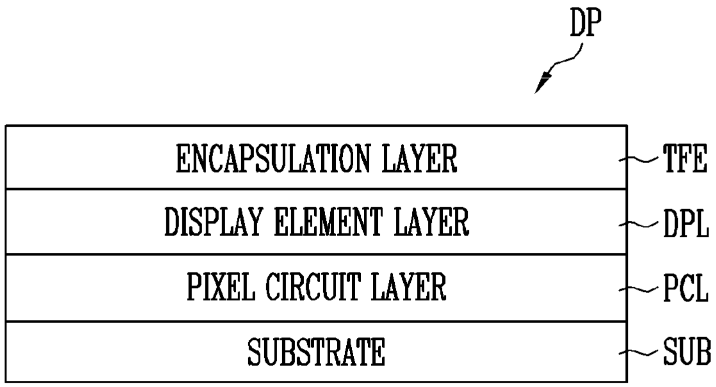
FIG. 2 is a schematic cross-sectional view of a display panel of FIG. 1.

FIG. 1 is a schematic plan view of a display device DD according to an embodiment, and FIG. 2 is a schematic cross-sectional view of a display panel DP of FIG. 1.

In FIG. 1 and FIG. 2, for better understanding and ease of description, a structure of the display device DD, particularly, of a display panel DP provided in the display device DD is briefly illustrated based on a display area DA in which an image is displayed.

Referring to FIG. 1 and FIG. 2, the display panel DP (or the display device DD) according to an embodiment may be provided in various shapes, for example, may be provided in a rectangular plate shape having two pairs of sides parallel to each other, but the disclosure is not limited thereto. In case that the display panel DP is provided in the rectangular plate shape, sides of a pair of sides may be provided to be longer than sides of another pair of sides.

At least a portion of the display panel DP may have flexibility, and the display panel DP may be foldable at the portion having the flexibility, but the disclosure is not limited thereto.

The display panel DP may display an image. As the display panel DP, a self-light emitting display panel such as an organic light emitting display panel (OLED panel) using an organic light emitting diode as a light emitting element, a micro-LED or nano-LED display panel using an ultra small light emitting diode as a light emitting element, a quantum dot organic light emitting display panel (QD OLED panel) using a quantum dot and an organic light emitting diode, or the like may be used. As the display panel DP, a non-light emitting display panel such as a liquid crystal display panel (LCD panel), an electro-phoretic display panel (EPD panel), an electro-wetting display panel (EWD panel), or the like may be used. In case that a non-light emitting display panel is used as the display panel DP, the display device DD may include a light emitting device that supplies light to the display panel DP.

The display panel DP may include a substrate SUB, and multiple pixels PXL may be provided on the substrate SUB.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, a crystalline glass substrate, and the like.

The flexible substrate may be one of a film substrate, a plastic substrate, which includes a polymer, and the like. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

An area of the substrate SUB may be provided as the display area DA in which pixels PXL are disposed, and the remaining area of the substrate SUB may be provided as a non-display area NDA. For example, the substrate SUB may include the display area DA including pixels PXL, and the non-display area NDA disposed adjacent to the display area DA (or around the display area DA).

The non-display area NDA may be disposed adjacent to the display area DA. The non-display area NDA may be provided in at least one side of the display area DA. For example, the non-display area NDA may surround a side (or edge) of the display area DA. The non-display area NDA may be provided with a wire part connected to each pixel PXL and a driver part connected to the wire part and driving the pixel PXL.

Each of the pixels PXL may be provided in the display area DA of the substrate SUB. The pixels PXL may include a light emitting element emitting white light and/or color light and a pixel circuit for driving the light emitting element. The pixel circuit may include at least one transistor electrically connected to the light emitting element. Each pixel PXL may emit light of one of red, green, and blue colors, but the disclosure is not limited thereto. Each pixel PXL may emit light of one of cyan, magenta, yellow, white, and other colors.

Multiple pixels PXL may be arranged in a matrix format along a row extending in a first direction DR1 and a column extending in a second direction DR2 intersecting the first direction DR1. An arrangement of the pixels PXL is not particularly limited, and the pixels PXL may be arranged in various forms. In an embodiment, in case that multiple pixels PXL are provided, the pixels PXL may have different areas (or sizes). For example, in the case in which the pixels PXL have different colors of emitted light, the pixels PXL for different color may be provided in different areas (or sizes) or in different shapes.

The driver part may provide a signal (e.g., a predetermined or selectable signal) and a power source (e.g., a predetermined or selectable power source) to each pixel PXL through the wire part, thereby controlling driving of the pixel PXL.

The display panel DP (or each of the pixels PXL) may include a pixel circuit layer PCL, a display element layer DPL, and an encapsulation layer TFE positioned on the substrate SUB.

The pixel circuit layer PCL may be provided on the substrate SUB, and may include multiple transistors and multiple signal wires connected to the transistors. For example, each transistor may have a structure in which a semiconductor pattern, a gate electrode, a source electrode, and a drain electrode are sequentially stacked with an insulating layer disposed between the semiconductor pattern, the gate electrode, the source electrode, and the drain electrode. The semiconductor pattern may include an amorphous silicon, a poly silicon, a low temperature poly silicon, an organic semiconductor, and/or an oxide semiconductor. The gate electrode, the source electrode, and the drain electrode may include one of aluminum (Al), copper (Cu), titanium (Ti), and molybdenum (Mo), but the disclosure is not limited thereto. The pixel circuit layer PCL may include at least one or more insulating layers.

The display element layer DPL may be disposed on the pixel circuit layer PCL. The display element layer DPL may include a light emitting element that emits light. The light emitting element may be, for example, an organic light emitting diode, but the disclosure is not limited thereto. In an embodiment, the light emitting element may be an inorganic light emitting element including an inorganic light emitting material, a light emitting element that emits light by changing a wavelength of light emitted by using a quantum dot, or the like.

The encapsulation layer TFE may be disposed on the display element layer DPL. The encapsulation layer TFE may be an encapsulation substrate, a multi-layered encapsulation film, or the like. In case that the encapsulation layer TFE is in a form of the encapsulation film, the encapsulation layer TFE may include an inorganic film and/or an organic film. For example, the encapsulation layer TFE may have a structure in which an inorganic film, an organic film, and an inorganic film are sequentially stacked. The encapsulation layer TFE may prevent external air and moisture from penetrating into the display element layer DPL and the pixel circuit layer PCL.

Figure 3:
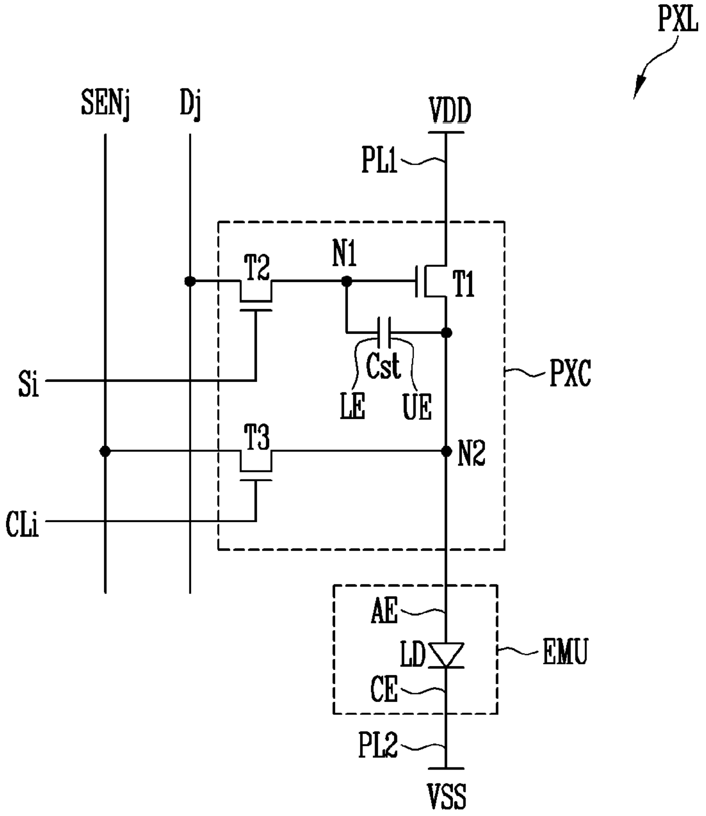
FIG. 3 is a schematic diagram of an equivalent circuit illustrating an electrical connection relationship of constituent elements included in each of pixels of FIG. 1.

FIG. 3 is a schematic diagram of an equivalent circuit illustrating an electrical connection relationship of constituent elements included in each of the pixels PXL of FIG. 1.

In FIG. 3, for better understanding and ease of description, a pixel PXL positioned in an i-th pixel row (or an i-th horizontal line) and connected to a j-th data wire Dj is illustrated (i and j may be natural numbers).

Referring to FIG. 1 to FIG. 3, the pixel PXL may include an emission component EMU that generates light with luminance corresponding to a data signal. The pixel PXL may further include a pixel circuit PXC for driving the emission component EMU.

The emission component EMU may include a light emitting element LD electrically connected between a first power wire PL1 to which a voltage of a first driving power source VDD is applied and a second power wire PL2 to which a voltage of a second driving power source VSS is applied. For example, the emission component EMU may include the light emitting element LD including a first electrode AE electrically connected to the first driving power source VDD via the pixel circuit PXC and the first power wire PL1 and a second electrode CE electrically connected to the second driving power source VSS via the second power wire PL2. The first electrode AE may be an anode, and the second electrode CE may be a cathode. The first driving power source VDD and the second driving power source VSS may have different potentials. A potential difference between the first and second driving power sources VDD and VSS may be set to be equal to or greater than a threshold voltage of the light emitting element LD during a light emitting period of the pixel PXL.

In case that the pixel PXL (or a sub-pixel) is positioned in an i-th row and a j-th column in the display area DA, the pixel circuit PXC of the pixel PXL (or the sub-pixel (see, e.g., “SPX1”, “SPX2”, and “SPX3” in FIG. 4)) may be electrically connected to an i-th scan wire Si and a j-th data wire Dj. The pixel circuit PXC may be also electrically connected to an i-th control line CLi and a j-th sensing line SENj.

The pixel circuit PXC may include first to third transistors T1, T2, and T3 and a storage capacitor Cst.

A first transistor T1 may be a driving transistor for controlling a driving current applied to the emission component EMU, and may be electrically connected between the first driving power source VDD and the emission component EMU. A first terminal of the first transistor T1 may be electrically connected to the first driving power source VDD through the first power wire PL1, a second terminal of the first transistor T1 may be electrically connected to a second node N2, and a gate electrode of the first transistor T1 may be electrically connected to a first node N1. The first transistor T1 may control an amount of the driving current applied to the emission component EMU from the first driving power source VDD through the second node N2 according to a voltage applied to the first node N1. In an embodiment, the first terminal of the first transistor T1 may be a drain electrode, and the second terminal of the first transistor T1 may be a source electrode, but the disclosure is not limited thereto. In an embodiment, the first terminal of the first transistor T1 may be a source electrode, and the second terminal of the first transistor T1 may be a drain electrode.

A second transistor T2 may be a switching transistor that selects the pixel PXL in response to a scan signal and activates the pixel PXL, and may be electrically connected between the data wire Dj (for example, the j-th data wire Dj) and the first node N1. A first terminal of the second transistor T2 may be electrically connected to the data wire Dj, a second terminal of the second transistor T2 may be electrically connected to the first node N1 (or the gate electrode of the first transistor T1), and a gate electrode of the second transistor T2 may be electrically connected to the scan wire Si (for example, the i-th scan wire Si). The first terminal and the second terminal of the second transistor T2 may be different terminals, and for example, in case that the first terminal is a drain electrode, the second terminal may be a source electrode.

In case that a scan signal of a gate-on voltage (for example, a high level voltage) is supplied from the scan wire Si, the second transistor T2 may be turned on to electrically connect the data wire Dj and the first node N1. The first node N1 may be a point at which the second terminal of the second transistor T2 is electrically connected to the gate electrode of the first transistor T1, and the second transistor T2 may transmit a data signal to the gate electrode of the first transistor T1.

A third transistor T3 may electrically connect the first transistor T1 to the sensing line SENj (for example, the j-th sensing line SENj), so that a sensing signal may be obtained through the sensing line SENj, and a characteristic of the pixel PXL such as a threshold voltage of the first transistor T1 or the like may be detected by using the sensing signal. Information on the characteristics of the pixel PXL may be used to convert image data so that a characteristic difference between the pixels PXL may be compensated for. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi (for example, the i-th control line CLi). In an embodiment, the first terminal of the third transistor T3 may be electrically connected to an initialization power source. In the embodiment, the third transistor T3 may be an initialization transistor that initializes the second node N2, and in case that a sensing control signal is supplied from the control line CLi, the third transistor T3 may be turned on to transmit a voltage of the initialization power source to the second node N2. Accordingly, the storage capacitor Cst electrically connected to the second node N2 may be initialized.

The storage capacitor Cst may include a lower electrode LE (or a first storage electrode) and an upper electrode UE (or a second storage electrode). The lower electrode LE may be electrically connected to the first node N1, and the upper electrode UE may be electrically connected to the second node N2. The storage capacitor Cst may be charged with a data voltage corresponding to the data signal supplied to the first node N1 during a frame period. Accordingly, the storage capacitor Cst may store a voltage corresponding to a difference between a voltage of the gate electrode of the first transistor T1 and a voltage of the second node N2.

FIG. 3 schematically illustrates an embodiment in which the first to third transistors T1, T2, and T3 are all N-type transistors, but the disclosure is not limited thereto. In another embodiment, at least one of the first to third transistors T1, T2, and T3 may be a P-type transistor. In an embodiment, the emission component EMU may be electrically connected between the first driving power source VDD and the pixel circuit PXC.

A structure of the pixel circuit PXC may be variously changed.

In the following embodiment, for better understanding and ease of description, a horizontal direction (an X-axis direction or a width direction) in a plan view is indicated as the first direction DR1, a vertical direction (a Y-axis direction or height direction) in a plan view is indicated as the second direction DR2, and a vertical direction in a cross-sectional view is indicated as the third direction DR3.

Figure 4:
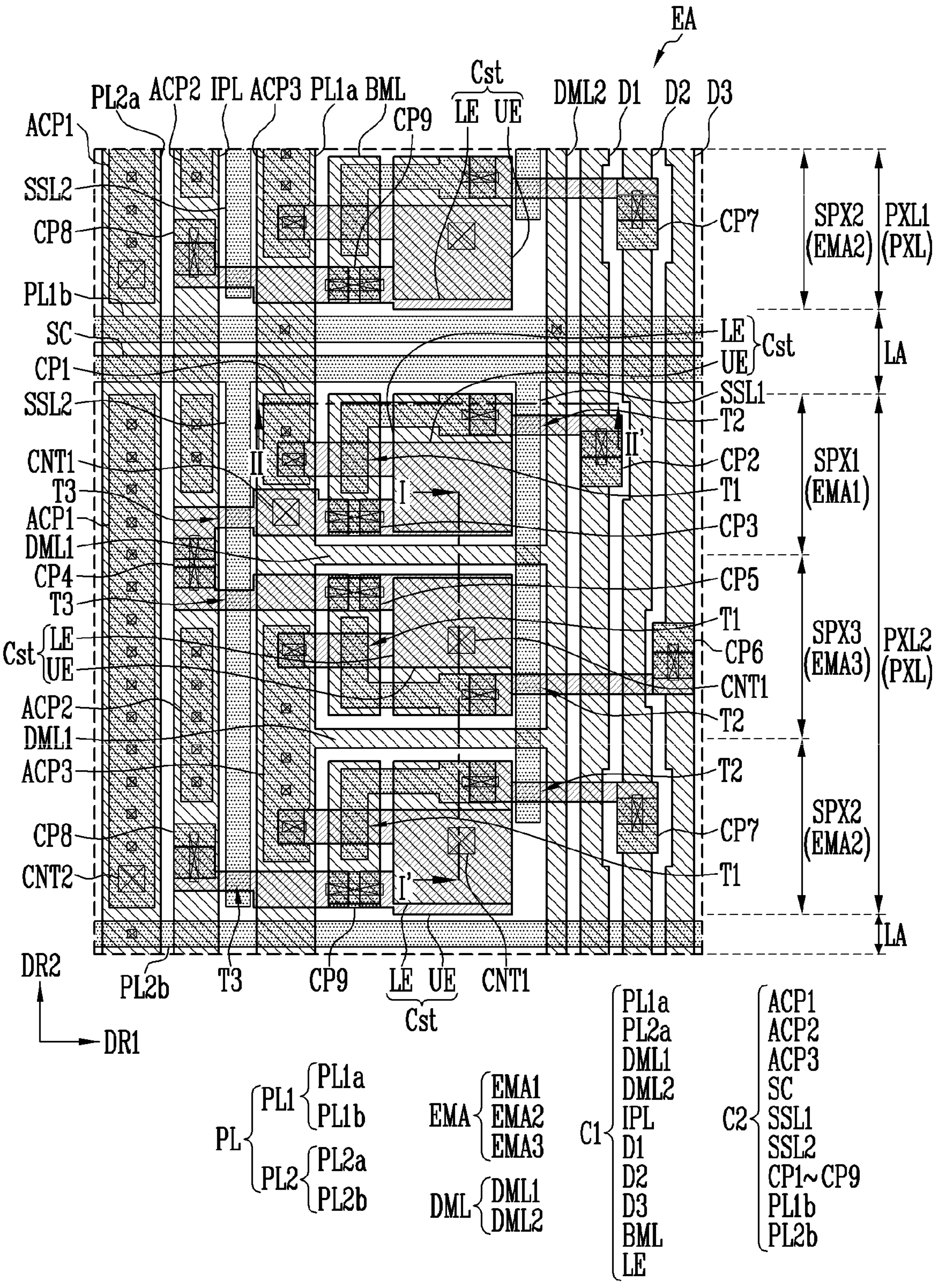
FIG. 4 is a schematic enlarged view of portion EA of the display device of FIG. 1.
Figure 5:
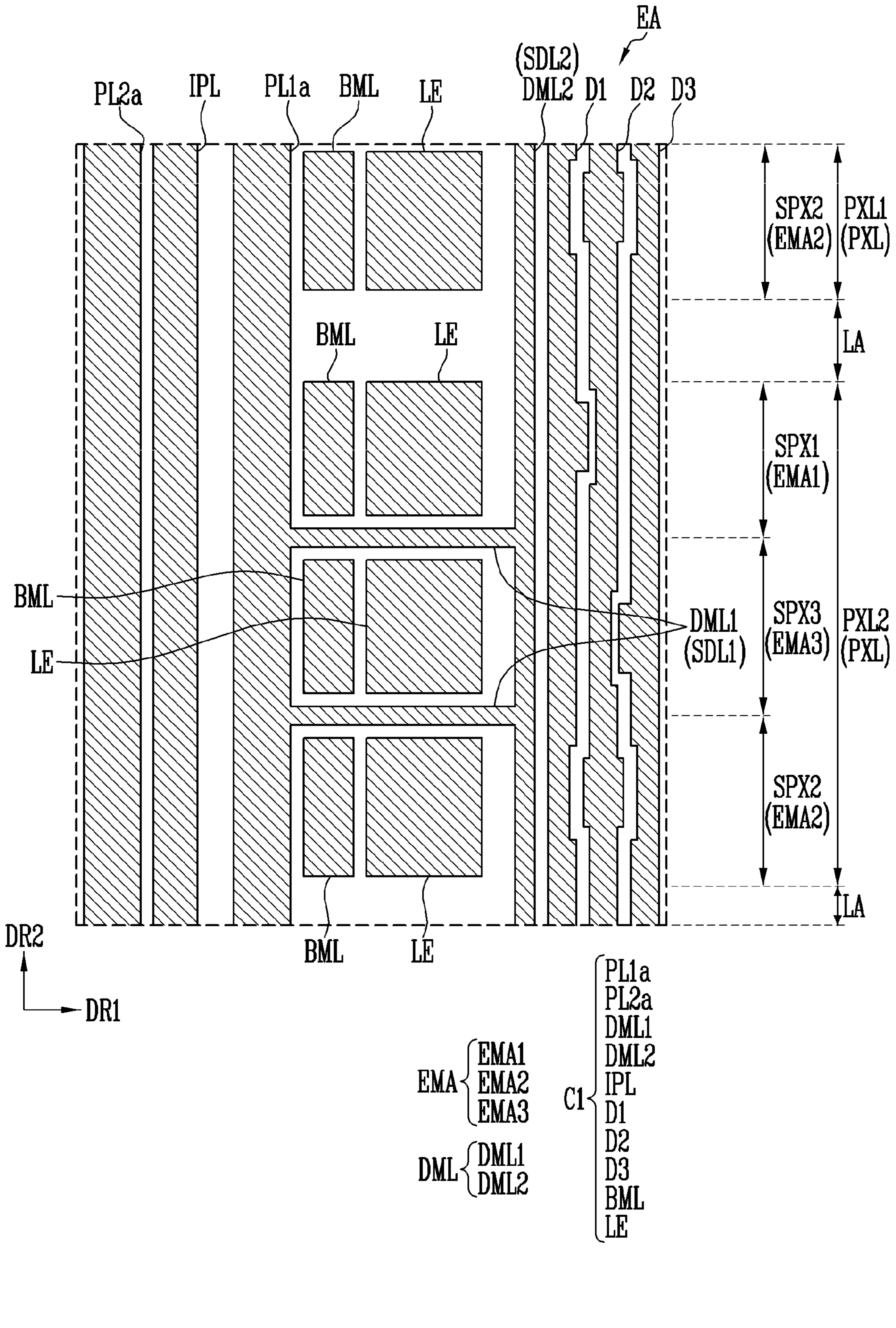
FIG. 5 is a schematic plan view of only components included in a first conductive layer in first and second pixels of FIG. 4.
Figure 6:
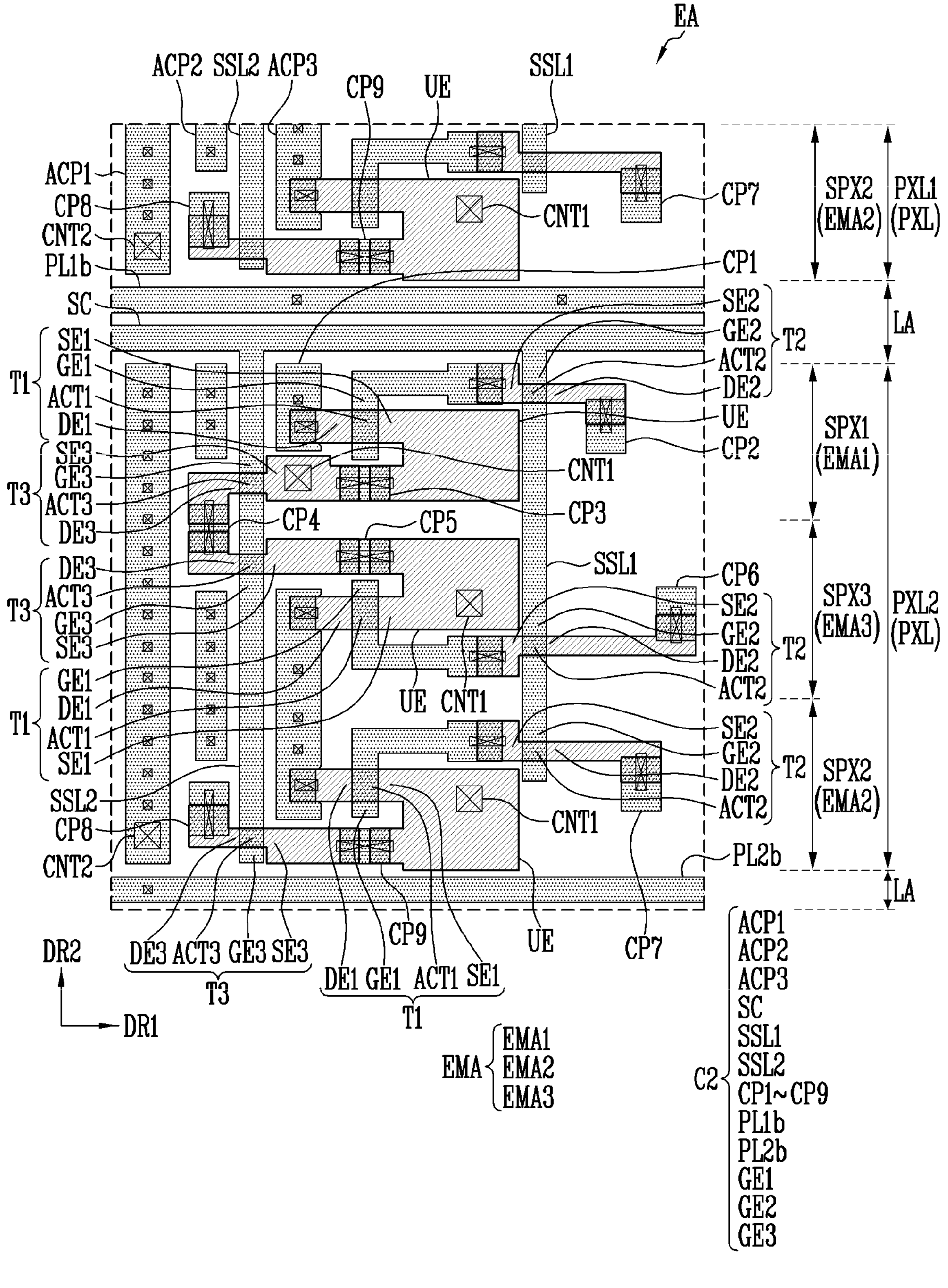
FIG. 6 is a schematic plan view of only transistors and components included in a second conductive layer in first and second pixels of FIG. 4.

FIG. 4 is a schematic enlarged view of portion EA of the display device DD of FIG. 1, FIG. 5 is a schematic plan view of only components included in a first conductive layer C1 in first and second pixels PXL1 and PXL2 of FIG. 4, and FIG. 6 is a schematic plan view of only transistors T1, T2, and T3 and components included in a second conductive layer C2 in first and second pixels PXL1 and PXL2 of FIG. 4.

In FIG. 4 to FIG. 6, not only constituent elements included in first and second pixels PXL1 and PXL2 but also an area in which the constituent elements are provided (or positioned) may be collectively referred to as a pixel PXL.

Referring to FIG. 1 to FIG. 6, in the display area DA, the first pixel PXL1 and the second pixel PXL2 disposed adjacent to each other and positioned in a same pixel column in the second direction DR2 may be provided. The display area DA may include a wire area LA positioned between two adjacently arranged pixels PXL (e.g., between one of the pixels PXL and an adjacent one of the pixels PXL) in the same pixel column. For example, the wire area LA may be positioned between the first pixel PXL1 and the second pixel PXL2, and between the second pixel PXL2 and a third pixel (not shown) positioned in a pixel row next to the second pixel PXL2. In an embodiment, the wire area LA may be an area in which signal wires extending in the first direction DR1 are disposed. For example, a first horizontal power wire PL1*b* and a scan wire SC generally extending in the first direction DR1 (or horizontal direction) may be disposed in a wire area LA, but the disclosure is not limited thereto. For example, a second horizontal power wire PL2*b* extending in the first direction DR1 (or horizontal direction) may be disposed in a wire area LA, but the disclosure is not limited thereto.

The first pixel PXL1 and the second pixel PXL2 may have substantially similar or identical structures. Hereinafter, the second pixel PXL2 will be described as a representative.

The second pixel PXL2 may include a first sub-pixel SPX1, a second sub-pixel PX2, and a third sub-pixel SPX3. For example, the second pixel PXL2 may include a first sub-pixel SPX1, a third sub-pixel SPX3, and a second sub-pixel SPX2 arranged in the second direction DR2 (or vertical direction). The display area DA in which the second pixel PXL2 is positioned may include a first light emitting area EMA1, a second light emitting area EMA2, and a third light emitting area EMA3. For example, the display area DA in which the second pixel PXL2 is positioned may include a first light emitting area EMA1, a third light emitting area EMA3, and a second light emitting area EMA2 partitioned in the second direction DR2.

The first light emitting area EMA1 may be an area in which light is emitted from a first light emitting element (see, e.g., "LD1" in FIG. 7) driven by a pixel circuit (see, e.g., "PXC" in FIG. 3) of the first sub-pixel SPX1. The first light emitting area EMA1 may be a light emitting area of the first sub-pixel SPX1.

The third light emitting area EMA3 may be an area in which light is emitted from a third light emitting element (see, e.g., "LD3" in FIG. 7) driven by a pixel circuit PXC of the third sub-pixel SPX3. The third light emitting area EMA3 may be a light emitting area of the third sub-pixel SPX3.

The second light emitting area EMA2 may be an area in which light is emitted from a second light emitting element (see, e.g., "LD2" in FIG. 7) driven by a pixel circuit PXC of the second sub-pixel SPX2. The second light emitting area EMA2 may be a light emitting area of the second sub-pixel SPX2.

The first light emitting area EMA1, the second light emitting area EMA2, and the third light emitting area EMA3 described above may form (or configure) a light emitting area EMA of the second pixel PXL2.

In the display area DA in which the second pixel PXL2 is positioned, signal wires electrically connected to the first to third sub-pixels SPX1, SPX2, and SPX3 (e.g., the first sub-pixel SPX1, the second sub-pixel SPX2, and the third sub-pixel SPX3) may be disposed. For example, a scan wire SC, data wires D1, D2, and D3, a power wire PL, an initialization power wire IPL, and the like may be disposed in the display area DA, but the disclosure is not limited thereto.

The scan wire SC may be positioned in the wire area LA of the display area DA, and may extend in the first direction DR1. The scan wire SC may selectively receive a scan signal and a sensing control signal. The scan wire SC may be formed of a second conductive layer C2. The second conductive layer C2 may be formed as a single film or a multi-film including molybdenum (Mo), copper (Cu), aluminum (Al), chromium (Cr), gold (Au), silver (Ag), titanium (Ti), nickel (Ni), neodymium (Nd), indium (In), tin (Sn), the like, an oxide thereof, or an alloy thereof.

In an embodiment, the scan wire SC may include a first sub-scan wire SSL1 and a second sub-scan wire SSL2 extending in the second direction DR2. The first and second sub-scan wires SSL1 and SSL2 may be configured of the second conductive layer C2, and may be integral with the scan wire SC. The first and second sub-scan wires SSL1 and SSL2 may be an area of the scan wire SC.

The first sub-scan wire SSL1 may be integral with a second gate electrode GE2 of a second transistor T2 of each of the first to third sub-pixels SPX1, SPX2, and SPX3. For example, a portion of the first sub-scan wire SSL1 may be the second gate electrode GE2 of the second transistor T2 of each of the first to third sub-pixels SPX1, SPX2, and SPX3.

The second sub-scan wire SSL2 may be integral with a third gate electrode GE3 of a third transistor T3 of each of the first to third sub-pixels SPX1, SPX2, and SPX3. For example, a portion of the second sub-scan wire SSL2 may be the third gate electrode GE3 of the third transistor T3 of each of the first to third sub-pixels SPX1, SPX2, and SPX3.

The scan wire SC may transmit a scan signal to the second gate electrode GE2 of the second transistor T2 of each of the first to third sub-pixels SPX1, SPX2, and SPX3 during a driving period of the light emitting element LD, and may transmit a sensing control signal to the third gate electrode GE3 of the third transistor T3 of each of the first to third sub-pixels SPX1, SPX2, and SPX3 during a sensing period.

The data wires D1, D2, and D3 may extend in the second direction DR2, and may include a first data wire D1, a second data wire D2, and a third data wire D3 arranged in the first direction DR1. Each of the first to third data wires D1, D2, and D3 may receive a data signal. Each of the first to third data wires D1, D2, and D3 and the data wire Dj (see, e.g., "Dj" in FIG. 3) may have a same configuration.

The first data wire D1 may be electrically connected to the second transistor T2 of the first sub-pixel SPX1, the second data wire D2 may be electrically connected to the second transistor T2 of the second sub-pixel SPX2, and the third data wire D3 may be electrically connected to the second transistor T2 of the third sub-pixel SPX3. Each of the first to third data wires D1, D2, and D3 may be formed of a first conductive layer C1. In an embodiment, the first conductive layer C1 and the second conductive layer C2 may include a same material. In an embodiment, the first conductive layer C1 may include one or more materials that can be included in the second conductive layer C2, but the disclosure is not limited thereto.

The power wire PL may include a first power wire PL1 and a second power wire PL2.

The first power wire PL1 may receive a voltage of the first driving power source VDD. The first power wire PL1 may include a first vertical power wire PL1*a* and a first horizontal power wire PL1*b*.

The first vertical power wire PL1*a* may extend in the second direction DR2, and may be disposed between the initialization power line IPL and a lower metal pattern BML of each of the first to third sub-pixels SPX1, SPX2, and SPX3 in a plan view. The first vertical power wire PL1*a* may be configured of the first conductive layer C1. The first vertical power wire PL1*a* may be electrically connected to a third additional conductive pattern ACP3 positioned on a different layer through a corresponding contact hole. The third additional conductive pattern ACP3 may be configured of the second conductive layer C2, and may extend in the second direction DR2 to overlap the first vertical power wire PL1*a* in a plan view. The first vertical power wire PL1*a* may be electrically connected to the third additional conductive pattern ACP3 positioned on the different layer through the corresponding contact hole to have a double layered structure. Accordingly, wire resistance of the first vertical power wire PL1*a* may decrease.

The first horizontal power wire PL1*b* may be positioned in the wire area LA of the display area DA, and may extend in the first direction DR1. The first horizontal power wire PL1*b* may be configured of the second conductive layer C2.

The first vertical power wire PL1*a* configured of the first conductive layer C1 and the first horizontal power wire PL1*b* configured of the second conductive layer C2 may be electrically connected to each other through a corresponding contact hole.

The second power wire PL2 may receive a voltage of the second driving power source VSS. The second power wire PL2 may include a second vertical power wire PL2*a* and a second horizontal power wire PL2*b*.

The second vertical power wire PL2*a* may extend in the second direction DR2, and may be positioned at a side (for example, a left side) of the initialization power wire IPL in a plan view. The second vertical power wire PL2*a* may be configured of the first conductive layer C1. The second vertical power wire PL2*a* may be electrically connected to a first additional conductive pattern ACP1 positioned on a different layer through a corresponding contact hole. The first additional conductive pattern ACP1 may be configured of the second conductive layer C2, and may extend in the second direction DR2 to overlap the second vertical power wire PL2*a* in a plan view. The second vertical power wire PL2*a* may be electrically connected to the first additional conductive pattern ACP1 positioned on the different layer through the corresponding contact hole to have a double layered structure. Accordingly, wire resistance of the second vertical power wire PL2*a* may decrease.

In an embodiment, the first additional conductive pattern ACP1 may be electrically connected to constituent elements of the emission component (see, e.g., "EMU" in FIG. 3) of each of the first to third sub-pixels SPX1, SPX2, and SPX3 through a second contact portion CNT2. For example, the first additional conductive pattern ACP1 may be electrically connected to a second electrode (see, e.g., "CE" in FIG. 7) commonly provided to the first to third sub-pixels SPX1, SPX2, and SPX3 through the second contact portion CNT2.

The second horizontal power wire PL2*b* may be positioned in the wire area LA of the display area DA, and may extend in the first direction DR1. The second horizontal power wire PL2*b* may be configured of the second conductive layer C2. The second vertical power wire PL2*a* configured of the first conductive layer C1 and the second horizontal power wire PL2*b* configured of the second conductive layer C2 may be electrically connected to each other through a corresponding contact hole.

The initialization power wire IPL may extend in the second direction DR2, and may be configured of the first conductive layer C1. The initialization power wire IPL may be disposed between the second vertical power wire PL2*a* and the first vertical power wire PL1*a* in a plan view. The second vertical power wire PL2*a*, the initialization power wire IPL, and the first vertical power wire PL1*a* may be spaced apart from each other in the first direction DR1. The initialization power wire IPL may be the sensing line SENj described with reference to FIG. 3. The initialization power wire IPL may receive the voltage of the initialization power source. The initialization power wire IPL may be electrically connected to the third transistor T3 of each of the first to third sub-pixels SPX1, SPX2, and SPX3. The initialization power wire IPL may be electrically connected to a second additional conductive pattern ACP2 positioned on a different layer through a corresponding contact hole. The second additional conductive pattern ACP2 may be configured of the second conductive layer C2, and may extend in the second direction DR2 to overlap the initialization power wire IPL in a plan view. The initialization power wire IPL may be electrically connected to the second additional conductive pattern ACP2 positioned on the different layer through the corresponding contact hole to have a double layered structure. Accordingly, wire resistance of the initialization power wire IPL may be reduced.

The pixel circuit (see, e.g., "PXC" in FIG. 3) of each of the first to third sub-pixels SPX1, SPX2, and SPX3 may include the first transistor T1, the second transistor T2, the third transistor T3, and the storage capacitor Cst.

The pixel circuit PXC of the first sub-pixel SPX1, the pixel circuit PXC of the second sub-pixel SPX2, and the pixel circuit PXC of the third sub-pixel SPX3 may have substantially similar or identical structures. Hereinafter, the pixel circuit PXC of the first sub-pixel SPX1 will be described, and the pixel circuit PXC of the second sub-pixel SPX2 and the pixel circuit PXC of the third sub-pixel SPX3 will be briefly described or omitted.

The pixel circuit PXC of the first sub-pixel SPX1 may include first to third transistors T1, T2, and T3 and a storage capacitor Cst (hereinafter referred to as a "first storage capacitor Cst").

The first transistor T1 may include a first gate electrode GE1, a first active pattern ACT1, a first source electrode SE1, and a first drain electrode DE1.

The first gate electrode GE1 may be electrically connected to a second source electrode SE2 of the second transistor T2 through a corresponding contact hole. The first gate electrode GE1 may be configured of the second conductive layer C2.

The first active pattern ACT1, the first source electrode SE1, and the first drain electrode DE1 may be configured of a semiconductor pattern made of a polysilicon, an amorphous silicon, an oxide semiconductor, or the like. The first active pattern ACT1, the first source electrode SE1, and the first drain electrode DE1 may be formed of a semiconductor layer in which no impurity is doped or an impurity is doped. For example, the first source electrode SE1 and the first drain electrode DE1 may have conductivity by being doped with an impurity, and the first active pattern ACT1 may be formed of an intrinsic semiconductor layer that is not doped with an impurity.

The first active pattern ACT1 may be positioned below the first gate electrode GE1 configured of the second conductive layer C2 to overlap the first gate electrode GE1 in a plan view. The first active pattern ACT1 may configure a channel area of the first transistor T1.

The first source electrode SE1 may be connected to an end of the first active pattern ACT1. The first source electrode SE1 may have conductivity by being doped with an impurity in an impurity doping process performed after forming the second conductive layer C2. The first source electrode SE1 may be electrically connected to a third conductive pattern CP3 through a corresponding contact hole.

The third conductive pattern CP3 may be configured of the second conductive layer C2, and may overlap the first source electrode SE1, the third source electrode SE3, and the lower metal pattern BML in a plan view. An end of the third conductive pattern CP3 may be electrically connected to the first source electrode SE1 through a corresponding contact hole. Another end of the third conductive pattern CP3 may be electrically connected to a third source electrode SE3 of the third transistor T3 through a corresponding contact hole. Another end of the third conductive pattern CP3 may be electrically connected to the lower metal pattern BML through a corresponding contact hole.

The first source electrode SE1, the lower metal pattern BML, and the third source electrode SE3 may be electrically connected to each other through the third conductive pattern CP3.

The lower metal pattern BML (or a first lower metal pattern) may be configured of the first conductive layer C1, and may overlap the first transistor T1 in a plan view. The lower metal pattern BML may be electrically connected to the third conductive pattern CP3 through a corresponding contact hole. The lower metal pattern BML may be electrically connected to the first source electrode SE1 through the third conductive pattern CP3. As the lower metal pattern BML electrically connected to the first source electrode SE1 through the third conductive pattern CP3, a driving range of a voltage supplied to the first gate electrode GE1 may be increased. As the lower metal pattern BML is electrically connected to the first source electrode SE1, floating of the lower metal pattern BML may be prevented.

The first drain electrode DE1 may be connected to another end of the first active pattern ACT1. The first drain electrode DE1 may have conductivity by being doped with an impurity in an impurity doping process performed after forming the second conductive layer C2. The first drain electrode DE1 may be electrically connected to the first conductive pattern CP1 through a corresponding contact hole.

The first conductive pattern CP1 may be configured of the second conductive layer C2, and may overlap the first drain electrode DE1 and the first vertical power wire PL1*b* in a plan view. A portion of the first conductive pattern CP1 may be electrically connected to the first drain electrode DE1 through a corresponding contact hole. Another portion of the first conductive pattern CP1 may be electrically connected to the first vertical power wire PL1*b* through a corresponding contact hole. The first drain electrode DE1 and the first vertical power wire PL1*b* may be electrically connected to each other through the first conductive pattern CP1.

The second transistor T2 may include a second gate electrode GE2, a second active pattern ACT2, a second source electrode SE2, and a second drain electrode DE2.

The second gate electrode GE2 may be integral with the first sub-scan wire SSL1, and may be configured of the second conductive layer C2. The second gate electrode GE2 may overlap the second active pattern ACT2 in a plan view.

The second active pattern ACT2, the second source electrode SE2, and the second drain electrode DE2 may be configured of a semiconductor pattern made of a polysilicon, an amorphous silicon, an oxide semiconductor, or the like. For example, the second source electrode SE2 and the second drain electrode DE2 may have conductivity by being doped with an impurity, and the second active pattern ACT2 may be formed of an intrinsic semiconductor layer that is not doped with an impurity.

The second active pattern ACT2 may be positioned below the second gate electrode GE2 configured of the second conductive layer C2 to overlap the second gate electrode GE2 in a plan view. The second active pattern ACT2 may configure a channel area of the second transistor T2.

The second source electrode SE2 may be connected to an end of the second active pattern ACT2. The second source electrode SE2 may have conductivity by being doped with an impurity in an impurity doping process performed after forming the second conductive layer C2. The second source electrode SE2 may be electrically connected to the first gate electrode GE1 through a corresponding contact hole.

The second drain electrode DE2 may be connected to another end of the second active pattern ACT2. The second drain electrode DE2 may have conductivity by being doped with an impurity in an impurity doping process performed after forming the second conductive layer C2. The second drain electrode DE2 may be electrically connected to the second conductive pattern CP2 through a corresponding contact hole.

The second conductive pattern CP2 may be configured of the second conductive layer C2, and may overlap the first data wire D1 and the second drain electrode DE2 in a plan view. A portion of the second conductive pattern CP2 may be electrically connected to the second drain electrode DE2 through a corresponding contact hole. Another portion of the second conductive pattern CP2 may be electrically connected to the first data wire D1 configured of the first conductive layer C1 through a corresponding contact hole. The second drain electrode DE2 and the first data wire D1 may be electrically connected through the second conductive pattern CP2.

The third transistor T3 may include a third gate electrode GE3, a third active pattern ACT3, a third source electrode SE3, and a third drain electrode DE3.

The third gate electrode GE3 may be integral with the second sub-scan wire SSL2. The third gate electrode GE3 may overlap the third active pattern ACT3 in a plan view.

The third active pattern ACT3, the third source electrode SE3, and the third drain electrode DE3 may be configured of a semiconductor pattern made of a polysilicon, an amorphous silicon, an oxide semiconductor, or the like. For example, the third source electrode SE3 and the third drain electrode DE3 may have conductivity by being doped with an impurity, and the third active pattern ACT3 may be formed of an intrinsic semiconductor layer that is not doped with an impurity.

The third source electrode SE3 may be connected to an end of the third active pattern ACT3. The third source electrode SE3 may have conductivity by being doped with an impurity in an impurity doping process performed after forming the second conductive layer C2. The third source electrode SE3 may be electrically connected to the third conductive pattern CP3 through a corresponding contact hole.

In an embodiment, the third source electrode SE3 may be electrically connected to the emission component EMU of the first sub-pixel SPX1 through a first contact portion CNT1. For example, the third source electrode SE3 may be electrically connected to a (1-1)-th electrode (see, e.g., "AE1" in FIG. 7) of the emission component EMU through the first contact portion CNT1.

The third drain electrode DE3 may be connected to another end of the third active pattern ACT3. The third drain electrode DE3 may have conductivity by being doped with an impurity in an impurity doping process performed after forming the second conductive layer C2. The third drain electrode DE3 may be electrically connected to a fourth conductive pattern CP4 through a corresponding contact hole.

The fourth conductive pattern CP4 may be configured of the second conductive layer C2, and may overlap an area of the initialization power wire IPL in a plan view. A portion of the fourth conductive pattern CP4 may be electrically connected to the third drain electrode DE3 through a corresponding contact hole. Another portion of the fourth conductive pattern CP4 may be electrically connected to the initialization power wire IPL through a corresponding contact hole. The third drain electrode DE3 and the initialization power wire IPL may be electrically connected to each other through the fourth conduction pattern CP4.

The first storage capacitor Cst may include a lower electrode LE and an upper electrode UE. The first storage capacitor Cst may be the storage capacitor Cst described with reference to FIG. 3.

The lower electrode LE may be configured of the first conductive layer C1, and may be disposed between the lower metal pattern BML and a second dummy wire DML2 in a plan view. In an embodiment, the lower electrode LE may overlap the first gate electrode GE1 and the second source electrode SE2 in a plan view, and may be electrically connected to the first gate electrode GE1 and the second source electrode SE2 through a corresponding contact hole.

The upper electrode UE may be integral with the first source electrode SE1. The upper electrode UE may be configured of a semiconductor pattern made of polysilicon, amorphous silicon, an oxide semiconductor, or the like, and may have conductivity after an impurity is doped. The upper electrode UE may be disposed to overlap the lower electrode LE in a plan view, and may have a size (or area) similar to or larger than the lower electrode LE, but the disclosure is not limited thereto.

In the first sub-pixel SPX1 having the configuration described above, the first source electrode SE1, the third source electrode SE3, the lower metal pattern BML, and the upper electrode UE may be electrically connected to the (1-1)-th electrode AE1 (or an anode) through the first contact portion CNT1.

The pixel circuit PXC of the second sub-pixel SPX2 may include first to third transistors T1, T2, and T3 and a storage capacitor Cst (hereinafter referred to as a "second storage capacitor Cst").

The first transistor T1 may include a first gate electrode GE1, a first active pattern ACT1, a first source electrode SE1, and a first drain electrode DE1.

The first gate electrode GE may be electrically connected to a second source electrode SE2 of the second transistor T2.

The first active pattern ACT1 may be a channel area of the first transistor T1.

The first source electrode SE1 may be connected to the first active pattern ACT1. The first source electrode SE1 may be electrically connected to a ninth conductive pattern CP9 through a corresponding contact hole.

The ninth conductive pattern CP9 may be configured of the second conductive layer C2, and may overlap the first source electrode SE1, the third source electrode SE3 of the third transistor T3, and the lower metal pattern BML in a plan view. A portion of the ninth conductive pattern CP9 may be electrically connected to the first source electrode SE1 through a corresponding contact hole. Another portion of the ninth conductive pattern CP9 may be electrically connected to the third source electrode SE3 of the third transistor T3 through the contact hole. Another portion of the ninth conductive pattern CP9 may be electrically connected to the lower metal pattern BML (or a second lower metal pattern) through a corresponding contact hole. The first source electrode SE1, the lower metal pattern BML, and the third source electrode SE3 may be electrically connected to each other through the ninth conductive pattern CP9.

The first drain electrode DE1 may be connected to the first active pattern ACT1. The first drain electrode DE1 may be electrically connected to the third additional conductive pattern ACP3 through a corresponding contact hole. As described above, as the third additional conductive pattern ACP3 is electrically connected to the first vertical power wire PL1*a*, the first drain electrode DE1 may be electrically connected to the first vertical power wire PL1*a* through the third additional conductive pattern ACP3.

The second transistor T2 may include a second gate electrode GE2, a second active pattern ACT2, a second source electrode SE2, and a second drain electrode DE2.

The second gate electrode GE2 may be integral with the first sub-scan wire SSL1, and may overlap the second active pattern ACT2 in a plan view.

The second active pattern ACT2 may be a channel area of the second transistor T2.

The second source electrode SE2 may be connected to the second active pattern ACT2. The second source electrode SE2 may be connected to the first gate electrode GE1.

The second drain electrode DE2 may be connected to the second active pattern ACT2. The second drain electrode DE2 may be electrically connected to a seventh conductive pattern CP7 through a corresponding contact hole.

The seventh conductive pattern CP7 may be configured of the second conductive layer C2, and may overlap the second drain electrode DE and the second data wire D2 in a plan view. An end of the seventh conductive pattern CP7 may be electrically connected to the second drain electrode DE2 through a corresponding contact hole. Another end of the seventh conductive pattern CP7 may be electrically connected to the second data wire D2 through a corresponding contact hole. The second drain electrode DE2 and the second data wire D2 may be electrically connected to each other through the seventh conductive pattern CP7.

The third transistor T3 may include a third gate electrode GE3, a third active pattern ACT3, a third source electrode SE3, and a third drain electrode DE3.

The third gate electrode GE3 may be integral with the second sub-scan wire SSL2, and may overlap the third active pattern ACT3 in a plan view.

The third active pattern ACT3 may be a channel area of the third transistor T3.

The third source electrode SE3 may be connected to the third active pattern ACT3. The third source electrode SE3 may be electrically connected to the ninth conductive pattern CP9 through a corresponding contact hole.

The third drain electrode DE3 may be connected to the third active pattern ACT3. The third drain electrode DE3 may be electrically connected to an eighth conductive pattern CP8 through a corresponding contact hole.

The eighth conductive pattern CP8 may be configured of the second conductive layer C2, and may overlap another area of the initialization power wire IPL in a plan view. An end of the eighth conductive pattern CP8 may be electrically connected to the third drain electrode DE3 through a corresponding contact hole. Another end of the eighth conductive pattern CP8 may be electrically connected to the initialization power wire IPL through a corresponding contact hole. The third drain electrode DE3 and the initialization power wire IPL may be electrically connected to each other through the eighth conduction pattern CP8.

The second storage capacitor Cst may include a lower electrode LE and an upper electrode UE. The second storage capacitor Cst may be the storage capacitor Cst described with reference to FIG. 3.

The lower electrode LE may be configured of the first conductive layer C1, and may be disposed between the lower metal pattern BML and the second dummy wire DML2 in a plan view. In an embodiment, the lower electrode LE may be electrically connected to the first gate electrode GE1 and the second source electrode SE2 through a corresponding contact hole.

The upper electrode UE may be integral with the first source electrode SE1. The upper electrode UE may be disposed to overlap the lower electrode LE in a plan view.

In an embodiment, the upper electrode UE may be electrically connected to the emission component EMU of the second sub-pixel SPX2 through the first contact portion CNT1. For example, the upper electrode UE may be electrically connected to a (1-2)-th electrode (see, e.g., "AE2" in FIG. 7) of the emission component EMU through the first contact portion CNT1.

In the second sub-pixel SPX2 having a configuration described above, the first source electrode SE1, the third source electrode SE3, the lower metal pattern BML, and the upper electrode UE may be electrically connected to the (1-2)-th electrode AE2 (or an anode) through the first contact portion CNT1.

The pixel circuit PXC of the third sub-pixel SPX3 may include first to third transistors T1, T2, and T3 and a storage capacitor Cst (hereinafter referred to as a "third storage capacitor Cst").

The first transistor T1 may include a first gate electrode GE1, a first active pattern ACT1, a first source electrode SE1, and a first drain electrode DE1.

The first gate electrode GE1 may be electrically connected to a second source electrode SE2 of the second transistor T2.

The first active pattern ACT1 may be a channel area of the first transistor T1.

The first source electrode SE1 may be connected to the first active pattern ACT1. The first source electrode SE1 may be electrically connected to a fifth conductive pattern CP5 through a corresponding contact hole.

The fifth conductive pattern CP5 may be configured of the second conductive layer C2, and may overlap the first source electrode SE1, the third source electrode SE3 of the third transistor T3, and the lower metal pattern BML in a plan view. A portion of the fifth conductive pattern CP5 may be electrically connected to the first source electrode SE1 through a corresponding contact hole. Another portion of the fifth conductive pattern CP5 may be electrically connected to the third source electrode SE3 of the third transistor T3 through a corresponding contact hole. Another portion of the fifth conductive pattern CP5 may be electrically connected to the lower metal pattern BML (or a third lower metal pattern) through a corresponding contact hole. The first source electrode SE1, the lower metal pattern BML, and the third source electrode SE3 may be electrically connected to each other through the fifth conductive pattern CP5.

The second transistor T2 may include a second gate electrode GE2, a second active pattern ACT2, a second source electrode SE2, and a second drain electrode DE2.

The second gate electrode GE2 may be integral with the first sub-scan wire SSL1, and may overlap the second active pattern ACT2 in a plan view.

The second active pattern ACT2 may be a channel area of the second transistor T2.

The second source electrode SE2 may be connected to the second active pattern ACT2. The second source electrode SE2 may be connected to the first gate electrode GE1.

The second drain electrode DE2 may be connected to the second active pattern ACT2. The second drain electrode DE2 may be electrically connected to a sixth conductive pattern CP6 through a corresponding contact hole.

The sixth conductive pattern CP6 may be configured of the second conductive layer C2, and may overlap the second drain electrode DE2 and the third data wire D3 in a plan view. An end of the sixth conductive pattern CP6 may be electrically connected to the second drain electrode DE2 through a corresponding contact hole. Another end of the sixth conductive pattern CP6 may be electrically connected to the third data wire D3 through a corresponding contact hole. The second drain electrode DE2 and the third data wire D3 may be electrically connected to each other through the sixth conductive pattern CP6.

The third transistor T3 may include a third gate electrode GE3, a third active pattern ACT3, a third source electrode SE3, and a third drain electrode DE3.

The third gate electrode GE3 may be integral with the second sub-scan wire SSL2, and may overlap the third active pattern ACT3 in a plan view.

The third active pattern ACT3 may be a channel area of the third transistor T3.

The third source electrode SE3 may be connected to the third active pattern ACT3. The third source electrode SE3 may be electrically connected to the fifth conductive pattern CP5 through a corresponding contact hole.

The third drain electrode DE3 may be connected to the third active pattern ACT3. The third drain electrode DE3 may be electrically connected to a fourth conductive pattern CP4 through a corresponding contact hole. As described above, as the fourth conductive pattern CP4 is electrically connected to the initialization power wire IPL, the third drain electrode DE3 may be electrically connected to the initialization power wire IPL through the fourth conductive pattern CP4.

The third storage capacitor Cst may include a lower electrode LE and an upper electrode UE. The third storage capacitor Cst may be the storage capacitor Cst described with reference to FIG. 3.

The lower electrode LE may be configured of the first conductive layer C1, and may be disposed between the lower metal pattern BML and the second dummy wire DML2 in a plan view. In an embodiment, the lower electrode LE may overlap the first gate electrode GE1 and the second source electrode SE2 in a plan view, and may be electrically connected to the first gate electrode GE1 and the second source electrode SE2 through a corresponding contact hole.

The upper electrode UE may be integral with the first source electrode SE1. The upper electrode UE may be disposed to overlap the lower electrode LE in a plan view. In an embodiment, the upper electrode UE may be electrically connected to the emission component EMU of the third sub-pixel SPX3 through the first contact portion CNT1. For example, the upper electrode UE may be electrically connected to a (1-3)-th electrode (see, e.g., "AE3" in FIG. 7) of the emission component EMU through the first contact portion CNT1.

In the third sub-pixel SPX3 having the configuration described above, the first source electrode SE1, the third source electrode SE3, the lower metal pattern BML, and the upper electrode UE may be electrically connected to the (1-3)-th electrode AE3 (or an anode) through the first contact portion CNT1.

In an embodiment, a dummy wire DML may be disposed in the display area DA. The dummy wire DML may include a first dummy wire DML1 and the second dummy wire DML2.

The first dummy wire DML1 may be configured of the first conductive layer C1, and may extend from the first vertical power wire PL1*a* in the first direction DR1. The first dummy wire DML1 may be integral with the first vertical power wire PL1*a*. The first dummy wire DML1 may be an area of the first vertical power wire PL1*a*. Accordingly, the first dummy wire DML1 and the first vertical power wire PL1*a* may receive a same voltage (or signal). For example, the first dummy wire DML1 may receive a voltage of the first driving power source VDD.

In an embodiment, the first dummy wire DML1 may be disposed between two adjacent sub-pixels in the second direction DR2 of the first to third sub-pixels SPX1, SPX2, and SPX3. For example, the first dummy wire DML1 may be disposed between the first sub-pixel SPX1 and the third sub-pixel SPX3 adjacent in the second direction DR2, and between the third sub-pixel SPX3 and the second sub-pixel SPX2 adjacent in the second direction DR2.

The first dummy wire DML1 may be positioned between the first storage capacitor Cst of the first sub-pixel SPX1 and the third storage capacitor Cst of the third sub-pixel SPX3, and between the third storage capacitor Cst of the third sub-pixel SPX3 and the second storage capacitor Cst of the second sub-pixel SPX3.

By disposing the first dummy wire DML1 between the first storage capacitor Cst and the third storage capacitor Cst, a phenomenon that the voltage (or signal) applied to the first gate electrode GE1 of the first sub-pixel SPX1 is changed according to a change in voltage (or signal) applied to the (1-3)-th electrodes AE3 of the third sub-pixel SPX3 may be reduced or prevented. Accordingly, the first dummy wire DML1 may be used as a first shielding member SDL1 to reduce or minimize a coupling cap (for example, a parasitic capacitor) that may occur between the first gate electrode GE1 of the first sub-pixel SPX1 and the (1-3)-th electrode AE3 of the third sub-pixel SPX3. The first dummy wire DML1 used as the first shielding member SDL1 may reduce or minimize a coupling cap that may occur between the first gate electrode GE1 of the first sub-pixel SPX1 and the first gate electrode GE1 of the third sub-pixel SPX3.

By disposing the first dummy wire DML1 between the third storage capacitor Cst and the second storage capacitor Cst, a phenomenon that the voltage (or signal) applied to the first gate electrode GE1 of the third sub-pixel SPX2 is changed according to a change in voltage (or signal) applied to the (1-2)-th electrodes AE2 of the second sub-pixel SPX2 may be reduced or prevented. Accordingly, the first dummy wire DML1 may be used as a first shielding member SDL1 to reduce or minimize a coupling cap (for example, a parasitic capacitor) that may occur between the first gate electrode GE1 of the third sub-pixel SPX3 and the (1-2)-th electrode AE2 of the second sub-pixel SPX2. The first dummy wire DML1 used as the first shielding member SDL1 may reduce or minimize a coupling cap that may occur between the first gate electrode GE1 of the third sub-pixel SPX3 and the first gate electrode GE1 of the second sub-pixel SPX2.

The second dummy wire DML2 may be configured of the first conductive layer C1, and may extend in the second direction DR2. The second dummy wire DML2 may be connected to the first dummy wire DML1 to be electrically and/or physically connected to the first vertical power wire PL1*a*. In an embodiment, the first vertical power wire PL1*a*, the first dummy wire DML1, and the second dummy wire DML2 may be integral with each other. In a plan view, the second dummy wire DML2 may face the first vertical power wire PL1*a* in the first direction DR1 with the first dummy wire DML1 between the second dummy wire DML2 and the first vertical power wire PL1*a*.

The first vertical power wire PL1*a*, the first dummy wire DML1, and the second dummy wire DML2 may be connected to each other to form a mesh structure (or shape) in the display area DA (or in the second pixel PXL2). Accordingly, the second dummy wire DML2 and the first vertical power wire PL1*a* (or the dummy wire DML1) may receive a same voltage (or signal). For example, the second dummy wire DML2 may receive a voltage of the first driving power source VDD. As described above, in case that the first vertical power wire PL1*a*, the first dummy wire DML1, and the second dummy wire DML2 form the mesh structure, the voltage of the first driving power source VDD may be uniformly supplied throughout the display area DA.

In an embodiment, the second dummy wire DML2 may be disposed between the pixel circuit PXC and the first data wire D1 of the first to third sub-pixels SPX1, SPX2, and SPX3. For example, the second dummy wire DML2 may be disposed between the first storage capacitor Cst of the first sub-pixel SPX1, the third storage capacitor Cst of the third sub-pixel SPX3, or the second storage capacitor Cst of the second sub-pixel SPX2 and the first data wire D1. The second dummy wire DML2 may be spaced apart from the first data wire D1 in the first direction DR1.

By disposing the second dummy wire DML2 between the first to third storage capacitors Cst and the first data wire D1, a phenomenon that the voltage applied to the first gate electrode GE1 of each of the first to third sub-pixels SPX1, SPX2, and SPX3 is changed according to a change in voltage (for example, data signal) applied to the first data line D1 may be reduced or prevented. Accordingly, the second dummy wire DML2 may be used as a second shielding member SDL2 to reduce or minimize a coupling cap (for example, a parasitic capacitor) that may occur between the first gate electrode GE1 of each of the first to third sub-pixels SPX1, SPX2, and SPX3 and the first data line D1.

According to the above-described embodiment, the first dummy line DML1 electrically and physically connected to the first vertical power line PL1*a* may be disposed between two adjacent sub-pixels arranged in the second direction DR2 to reduce or minimize a coupling cap between the first gate electrode GE1 of a sub-pixel positioned at the upper side in the second direction DR2 among the two sub-pixels and the anode of the remaining sub-pixels located at a lower side, so that reliability of the display device DD may be improved.

According to the above-described embodiment, the second dummy wire DML2 electrically and physically connected to the first dummy wire DML1 may be disposed between the storage capacitor Cst of the first to third sub-pixels SPX1, SPX2, and SPX3 and the first data wire D1 to reduce or minimize a coupling cap between the first gate electrode GE1 of each of the first to third sub-pixels SPX1, SPX2, and SPX3 and the first data line D1, so that reliability of the display device DD may be further improved.

Hereinafter, a stacked structure (or a cross-sectional structure) of the second pixel PXL2 according to the above-described embodiment will be described with reference to FIG. 7 to FIG. 9.

Figure 7:
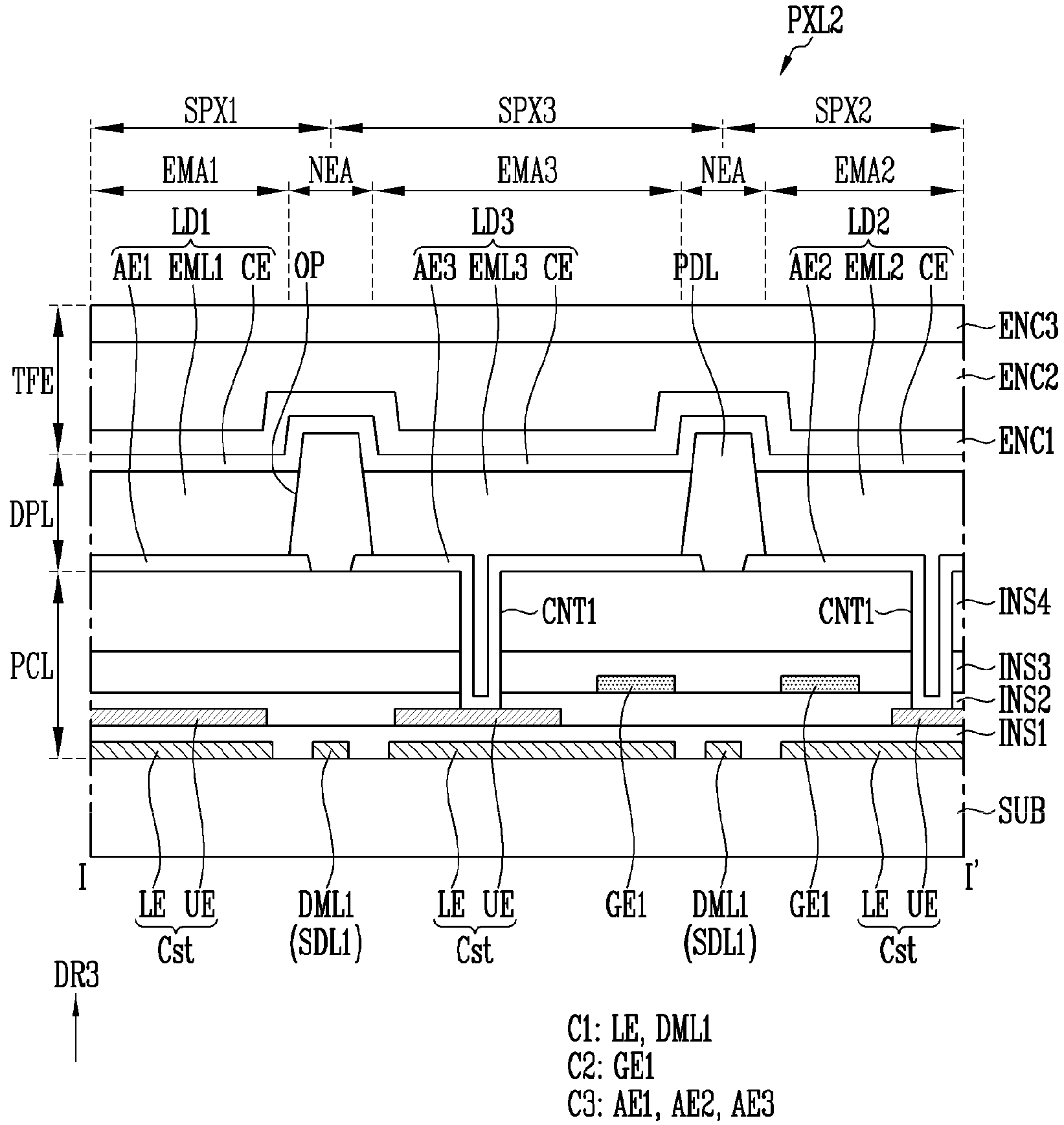
FIG. 7 is a schematic cross-sectional view taken along line I-I' of FIG. 4.
Figure 8:
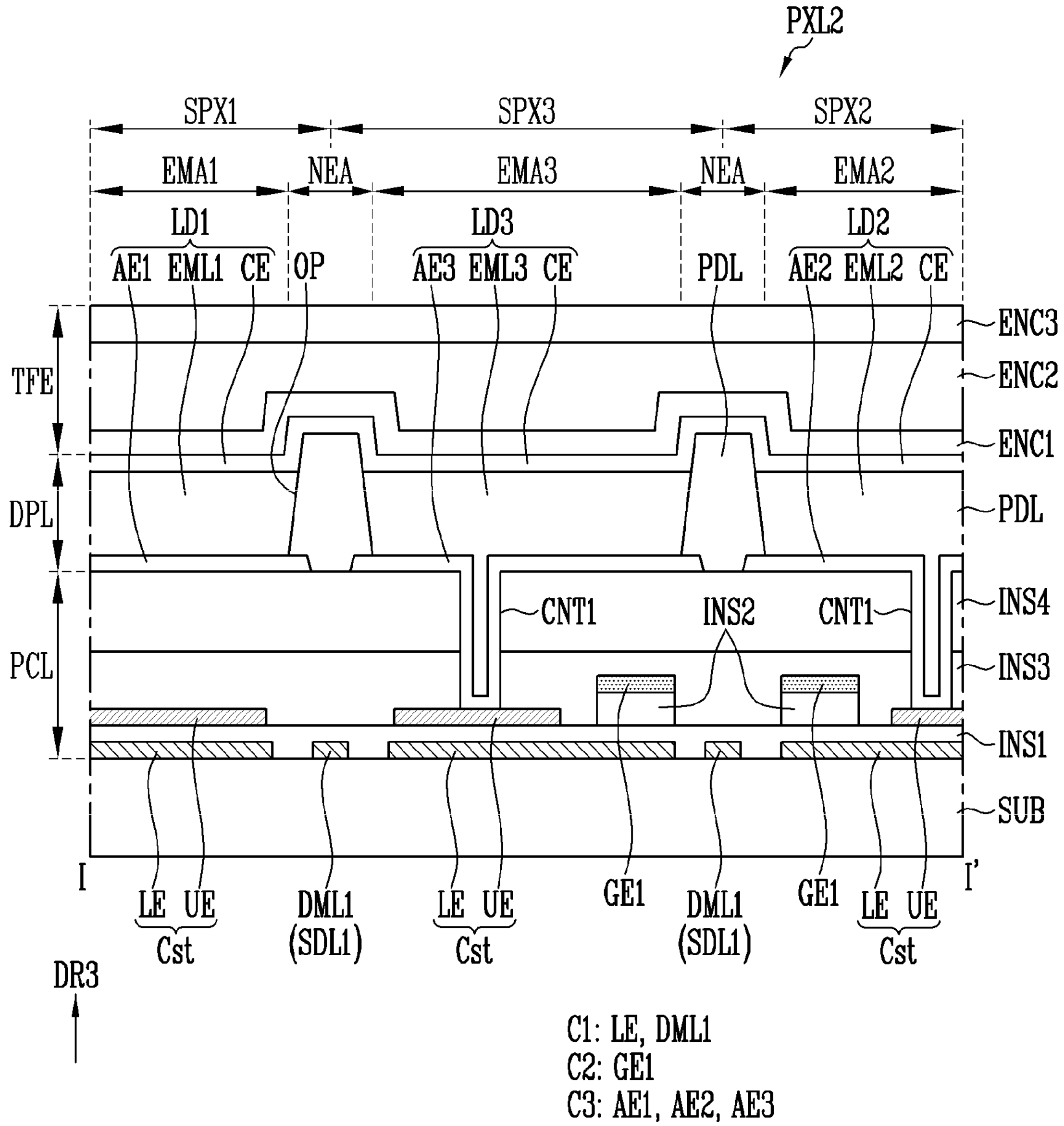
FIG. 8 is a schematic cross-sectional view taken along line I-I' of FIG. 4.
Figure 9:
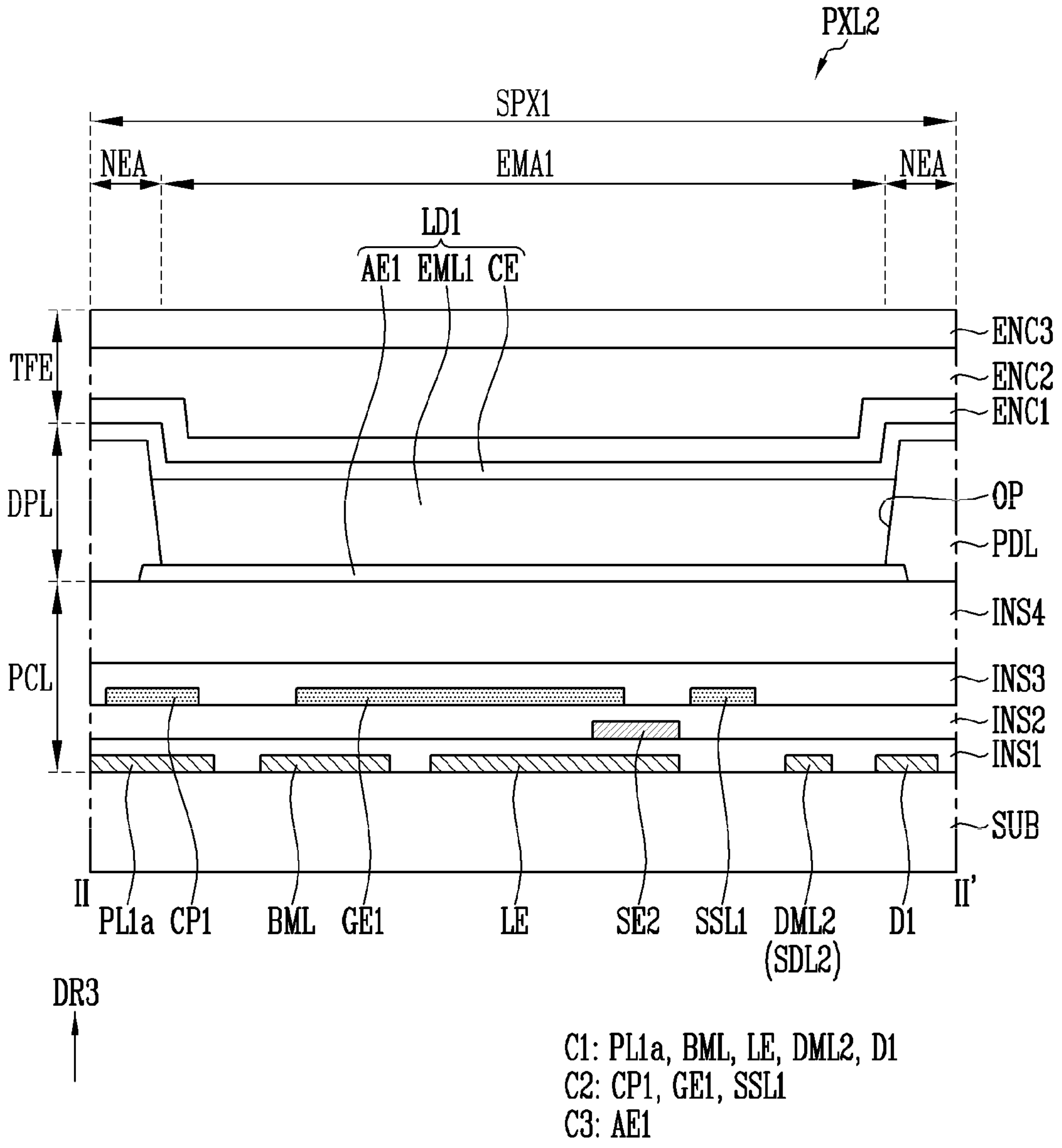
FIG. 9 is a schematic cross-sectional view taken along line II-II' of FIG. 4.

FIG. 7 and FIG. 8 are schematic cross-sectional views taken along line I-I' of FIG. 4, and FIG. 9 is a schematic cross-sectional view taken along line II-II' of FIG. 4.

FIG. 8 is different from the embodiment of FIG. 7 in a position of a second insulating layer INS2.

In the embodiment of FIG. 7 to FIG. 9, the stacked structure (or the cross-sectional structure) of the second pixel PXL2 may be simplified and shown, such as showing each electrode only as an electrode of a single film, and each insulating layer only as an insulating layer of a single film, but the disclosure is not limited thereto.

In relation to the embodiments of FIG. 7 to FIG. 9, differences from the above-described embodiment will be described in order to avoid duplicate descriptions.

Referring to FIG. 1 to FIG. 9, the second pixel PXL2 according to an embodiment may include the first sub-pixel SPX1, the third sub-pixel SPX3, and the second sub-pixel SPX2 that are arranged adjacent to each other in the second direction DR2. The first sub-pixel SPX1 may include a first light emitting area EMA1 and a non-light emitting area NEA surrounding the first light emitting area EMA1 (or adjacent to the first light emitting area EMA1). The second sub-pixel SPX2 may include a second light emitting area EMA2 and a non-light emitting area NEA surrounding the second light emitting area EMA2 (or adjacent to the second light emitting area EMA2). The third sub-pixel SPX3 may include a third light emitting area EMA3 and a non-light emitting area NEA surrounding the third light emitting area EMA3 (or adjacent to the third light emitting area EMA3).

Each of the first to third sub-pixels SPX1, SPX2, and SPX3 may include a substrate SUB, a pixel circuit layer PCL, a display element layer DPL, and an encapsulation layer TFE.

The substrate SUB may include a transparent insulating material to transmit light. The substrate SUB may be a rigid substrate or a flexible substrate.

In the pixel circuit layer PCL, circuit elements (for example, the first to third transistors T1, T2, and T3) and signal wires electrically connected to the circuit elements may be disposed. In the display element layer DPL, the light emitting element (see, e.g., "LD" in FIG. 3) electrically connected to the circuit elements of each of the first to third sub-pixels SPX1, SPX2, and SPX3 may be disposed.

At least one or more insulating layers may be disposed on the substrate SUB. At least one or more insulating layers may include a first insulating layer INS1, a second insulating layer INS2, a third insulating layer INS3, and a fourth insulating layer INS4. For example, a first insulating layer INS1, a second insulating layer INS2, a third insulating layer INS3, and a fourth insulating layer INS4 may be sequentially stacked on the substrate SUB in the third direction DR3. At least one conductive layer may be disposed on the substrate SUB. For example, the at least one conductive layer may include a first conductive layer C1 disposed on the substrate SUB, a second conductive layer C2 disposed on the second insulating layer INS2, and a third conductive layer C3 disposed on the fourth insulating layer INS4.

The first conductive layer C1 may include the first vertical power wire PL1*a*, the second vertical power wire PL2*a*, the initialization power wire IPL, the first to third data wires D1, D2, and D3, the lower metal pattern BML, the lower electrode LE, and the first and second dummy wires DML1 and DML2. The second conductive layer C2 may include the first horizontal power wire PL1*b*, the second horizontal power wire PL2*b*, the first to third gate electrodes GE1, GE2, and GE3, the first to third additional conductive patterns ACP1, ACP2, and ACP3, the scan wire SC, the first and second sub-scan wires SSL1 and SSL2, and the first to ninth conductive patterns CP1 to CP9. The third conductive layer C3 may include the (1-1)-th electrode AE1, the (1-2)-th electrode AE2, and the (1-3)-th electrode AE3.

The pixel circuit layer PCL may be disposed on the substrate SUB. The above-described first to fourth insulating layers INS1, INS2, INS3, and INS4 may be disposed in the pixel circuit layer PCL.

The first insulating layer INS1 (or a buffer layer) may be entirely disposed on the substrate SUB. The first insulating layer INS1 may prevent impurities from spreading into the first to third transistors T1, T2, and T3. The first insulating layer INS1 may be an inorganic insulating film including an inorganic material. The first insulating layer INS1 may include at least one of a silicon nitride ($SiN_x$), a silicon oxide ($SiO_x$), and a silicon oxynitride ($SiO_xN_y$), or may include at least one of metal oxides such as an aluminum oxide ($Al_xO_y$) or the like. The first insulating layer INS1 may be provided as a single film, or may be provided as a multi-film of at least two or more films. In case that the first insulating layer INS1 is provided as a multi-film, each film of the multi-film may be made of a same material or different materials. The first insulating layer INS1 may be omitted depending on a material, a process condition, and the like of the substrate SUB.

The second insulating layer INS2 (or gate insulating layer) may be entirely disposed on the first insulating layer INS1. The second insulating layer INS2 and the first insulating layer INS1 may include a same material. The second insulating layer INS2 may include a material that can be included in the first insulating layer INS1. For example, the second insulating layer INS2 may be an inorganic insulating film including an inorganic material. In an embodiment, the second insulating layer INS2, as shown in FIG. 8, may be disposed on a portion of the first insulating layer INS1. For example, the second insulating layer INS2 may be etched together with a base material of the second conductive layer C2 during a manufacturing process of the second conductive layer C2 so that the second insulating layer INS2 is disposed only under the second conductive layer C2. The second insulating layer INS2 and the second conductive layer C2 positioned on the second insulating layer INS2 may have a same width, but the disclosure is not limited thereto.

The third insulating layer INS3 (or an interlayer insulating layer) may be entirely provided and/or formed on the second insulating layer INS2. The third insulating layer INS3 and the first insulating layer INS1 may include a same material. The third insulating layer INS3 may include one or more materials that can be included in the first insulating layer INS1. For example, the third insulating layer INS3 may be an inorganic insulating film including an inorganic material.

The fourth insulating layer INS4 (or a via layer) may be entirely provided and/or formed on the third insulating layer INS3. The fourth insulating layer INS4 may be an inorganic insulating film including an inorganic material or an organic insulating film including an organic material. The inorganic insulating film may include, for example, at least one of a silicon oxide ($SiO_x$), a silicon nitride ($SiN_x$), a silicon oxynitride ($SiO_xN_y$), an aluminum oxide ($Al_xO_y$). The organic insulating film may include, for example, at least one of a polyacrylates resin, an epoxy resin, a phenolic resin, a polyamides resin, a polyimides resin, an unsaturated polyesters resin, a poly-phenylene ethers resin, a poly-phenylene sulfides resin, and a benzocyclobutene resin. In an embodiment, the fourth insulating layer INS4 may be an organic insulating film including an organic material.

Each of the aforementioned second to fourth insulating layers INS2, INS3, and INS4 may be partially opened to include the first contact portion CNT1 (or a first contact hole) and the second contact portion CNT2 (or a second contact hole). The first contact portion CNT1 may be a connection point for electrically connecting the pixel circuit PXC of each of the first to third sub-pixels SPX1, SPX2, and SPX3 and the light emitting element LD of the corresponding sub-pixel SPX1, SPX2, or SPX3. The second contact portion CNT2 may be a connection point for electrically connecting the second electrode CE of each of the first to third sub-pixels SPX1, SPX2, and SPX3 and the second power wire PL2 electrically connected to the corresponding sub-pixel SPX1, SPX2, or SPX3.

The pixel circuit layer PCL of each of the first to third sub-pixels SPX1, SPX2, and SPX3 may include the first to third transistors T1, T2, and T3 and the storage capacitor Cst disposed on the first insulating layer INS1. The lower electrode LE and the lower metal pattern BML may be disposed in the pixel circuit layer PCL of each of the first to third sub-pixels SPX1, SPX2, and SPX3.

The first transistor T1 may include the first active pattern ACT1, the first source electrode SE1, and the first drain electrode DE1 disposed on the first insulating layer INS1, and the first gate electrode GE1 disposed on the second insulating layer INS2 and configured of the second conductive layer C2. The bottom metal pattern BML may be disposed under the first transistor T1. The lower metal pattern BML may be configured of the first conductive layer C1 positioned between the substrate SUB and the first insulating layer INS1.

The second transistor T2 may include the second active pattern ACT2, the second source electrode SE2, and the second drain electrode DE2 disposed on the first insulating layer INS1, and the second gate electrode GE2 disposed on the second insulating layer INS2 and configured of the second conductive layer C2.

The third transistor T3 may include the third active pattern ACT3, the third source electrode SE3, and the third drain electrode DE3 disposed on the first insulating layer INS1, and the third gate electrode GE3 disposed on the second insulating layer INS2 and configured of the second conductive layer C2.

The storage capacitor Cst of each of the first to third sub-pixels SPX1, SPX2, and SPX3 may include the lower electrode LE disposed on the substrate SUB and the upper electrode UE overlapping the lower electrode LE in a plan view with the first insulating layer INS1 between the lower electrode LE and the upper electrode UE. The lower electrode LE may be configured of the first conductive layer C1 positioned between the substrate SUB and the first insulating layer INS1. The upper electrode UE may be disposed on the first insulating layer INS1, and may be formed of a semiconductor pattern that is doped with an impurity to have conductivity. The upper electrode UE of each of the first to third sub-pixels SPX1, SPX2, and SPX3 may be integral with the first source electrode SE1 of the corresponding sub-pixel SPX1, SPX2, or SPX3.

In an embodiment, the first dummy wire DML1 may be disposed in an area between the first sub-pixel SPX1 and the third sub-pixel SPX3, and in an area between the third sub-pixel SPX3 and the second sub-pixel SPX2. For example, the first dummy wire DML1 may be positioned in the non-light emitting area NEA shared by the first sub-pixel SPX1 and the third sub-pixel SPX3, and the non-light emitting area NEA shared by the third sub-pixel SPX3 and the second sub-pixel SPX2. The first dummy wire DML1 may be disposed on the substrate SUB in the non-light emitting area NEA. The first dummy wire DML1 may be configured of the first conductive layer C1 disposed between the substrate SUB and the first insulating layer INS1.

The first dummy wire DML1 may be disposed between the storage capacitor Cst of the first sub-pixel SPX1 and the storage capacitor Cst of the third sub-pixel SPX3. In a schematical cross-sectional view, the first dummy wire DML1 may be disposed on the substrate SUB between the lower electrode LE of the storage capacitor Cst of the first sub-pixel SPX1 and the lower electrode LE of the storage capacitor Cst of the third sub-pixel SPX3.

The first dummy wire DML1 may be disposed between the storage capacitor Cst of the third sub-pixel SPX3 and the storage capacitor Cst of the second sub-pixel SPX2. In a schematical cross-sectional view, the first dummy wire DML1 may be disposed on the substrate SUB between the lower electrode LE of the storage capacitor Cst of the third sub-pixel SPX3 and the lower electrode LE of the storage capacitor Cst of the second sub-pixel SPX2.

In an embodiment, the second dummy line DML2 may be disposed between the first data line D1 and the storage capacitor Cst of each of the first to third sub-pixels SPX1, SPX2, and SPX3. The second dummy wire DML2 may be configured of the first conductive layer C1 disposed between the substrate SUB and the first insulating layer INS1, and may be electrically and physically connected to the first dummy wire DML1. In a schematical cross-sectional view, the second dummy wire DML2 may be disposed on the substrate SUB between the lower electrode LE of the storage capacitor Cst of the first sub-pixel SPX1 and the first data wire D1.

In an embodiment, the first to third transistors T1, T2, and T3 and the storage capacitor Cst configuring the pixel circuit PXC of each of the first to third sub-pixels SPX1, SPX2, and SPX3 may include conductive patterns formed of the first conductive layer C1 and the second conductive layer C2.

The third insulating layer INS3 and the fourth insulating layer INS4 may be continuously provided and/or formed on the second conductive layer C2 of each of the first to third sub-pixels SPX1, SPX2, and SPX3.

The display element layer DPL may be provided and/or formed on the fourth insulating layer INS4. The display element layer DPL may include the first light emitting element LD1, the second light emitting element LD2, the third light emitting element LD3, and a pixel defining layer PDL.

The first light emitting element LD1 may include a (1-1)-th electrode AE1, a first light emitting layer EML1, and a second electrode CE. The second light emitting element LD2 may include a (1-2)-th electrode AE2, a second light emitting layer EML2, and a second electrode CE. The third light emitting element LD3 may include a (1-3)-th electrode AE3, a third light emitting layer EML3, and a second electrode CE. Each of the first to third light emitting elements LD1, LD2, and LD3 may be electrically connected to the pixel circuit PXC of the corresponding sub-pixel SPX1, SPX2, or SPX3.

The (1-1)-th electrode AE1, the (1-3)-th electrode AE3, and the (1-2)-th electrode AE2 may be configured of the third conductive layer C3 provided and/or formed on the fourth insulating layer INS4 of the corresponding sub-pixel SPX1, SPX2, or SPX3.

The (1-1)-th electrode AE1, the (1-3)-th electrode AE3, and the (1-2)-th electrode AE2 may be spaced apart from each other on the fourth insulating layer INS4. The (1-1)-th electrode AE1 may be an anode of the first light emitting element LD1, the (1-3)-th electrode AE3 may be an anode of the third light emitting element LD3, and the (1-2)-th electrode AE2 may be an anode of the second light emitting element LD2.

The (1-1)-th electrode AE1 may be electrically connected to the third source electrode SE3 of the third transistor T3 of the first sub-pixel SPX1 (or the upper electrode of the storage capacitor Cst of the first sub-pixel SPX1) through the corresponding first contact portion CNT1. The (1-2)-th electrode AE2 may be electrically connected to the first source electrode SE1 of the first transistor T1 of the second sub-pixel SPX2 (or the upper electrode of the storage capacitor Cst of the second sub-pixel SPX2) through the corresponding first contact portion CNT1. The (1-3)-th electrode AE3 may be electrically connected to the first source electrode SE1 of the first transistor T1 of the third sub-pixel SPX3 (or the upper electrode of the storage capacitor Cst of the third sub-pixel SPX3) through the corresponding first contact portion CNT1.

Each of the (1-1)-th electrode AE1, the (1-2)-th electrode AE2, and the (1-3)-th electrode AE3 may be made of a conductive material (or substance). In an embodiment, each of the (1-1)-th electrode AE1, the (1-2)-th electrode AE2, and the (1-3)-th electrode AE3 may include an opaque metal. In an embodiment, each of the (1-1)-th electrode AE1, the (1-2)-th electrode AE2, and the (1-3)-th electrode AE3 may include silver (Ag), magnesium (Mg), aluminum (Al), platinum (Pt), palladium (Pd), gold (Au), nickel (Ni), neodymium (Nd), iridium (Ir), chromium (Cr), titanium (Ti), the like, or an alloy thereof. However, the material of each of the (1-1)-th electrode AE1, the (1-2)-th electrode AE2, and the (1-3)-th electrode AE3 is not limited to the above-described example. In an embodiment, the (1-1)-th electrode AE1, the (1-2)-th electrode AE2, and the (1-3)-th electrode AE3 may include a transparent conductive material (or substance). In an embodiment, ach of the (1-1)-th electrode AE1, the (1-2)-th electrode AE2, and the (1-3)-th electrode AE3 may include a conductive oxide such as an indium tin oxide (ITO), an indium zinc oxide (IZO), a zinc oxide ($ZnO_x$), an indium gallium zinc oxide (IGZO), an indium tin zinc oxide (ITZO), and the like, and a conductive polymer such as poly(3,4-ethylenedioxythiophene) (PEDOT) and the like. In case that the (1-1)-th electrode AE1, the (1-2)-th electrode AE2, and the (1-3)-th electrode AE3 include a transparent conductive material (or substance), a separate conductive layer made of an opaque metal for reflecting light emitted from the first, second, and third light-emitting layers EML1, EML2, and EML3 in an image display direction of the display device DD (or in an upper direction of the encapsulation layer TFE) may be added.

The (1-1)-th electrode AE1 may be positioned in at least first light emitting area EMA1, the (1-2)-th electrode AE2 may be positioned in at least second light emitting area EMA2, and the (1-3)-th electrode AE3 may be positioned in at least third light emitting area EMA3.

The pixel defining layer PDL may define (or partition) the first light emitting area EMA1, the second light emitting area EMA2, and the third light emitting area EMA3. The pixel defining layer PDL may include an organic insulating film made of an organic material. In an embodiment, the pixel defining layer PDL may include an acryl resin, an epoxy resin, a phenolic resin, a polyamide resin, a polyimide resin, or the like. In an embodiment, the pixel defining layer PDL may include a light absorbing material, or may serve to absorb light introduced from an outside by a light absorbing agent being applied on the pixel defining layer PDL. For example, the pixel defining layer PDL may include a carbon-based black pigment. However, the disclosure is not limited thereto.

The pixel defining layer PDL may be partially opened to include an opening OP exposing an area of each of the (1-1)-th, (1-2)-th, and (1-3)-th electrodes AE1, AE2, and AE3, and may protrude from the fourth insulating layer INS4 in the third direction DR3 along a circumference of each of the first, second, and third light emitting areas EMA1, EMA2, and EMA3.

The first light emitting layer EML1 may be disposed on the (1-1)-th electrode AE1 exposed by the opening OP of the pixel defining layer PDL, the second light emitting layer EML2 may be disposed on the (1-2)-th electrodes AE2 exposed by another opening OP of the pixel defining layer PDL, and the third light emitting layer EML3 may be disposed on the (1-3)-th electrodes AE3 exposed by another opening OP of the pixel defining layer PDL. The first light emitting layer EML1 may be positioned only on the (1-1)-th electrode AE1 within the opening OP of the pixel defining layer PDL, the second light emitting layer EML2 may be positioned only on the (1-2)-th electrodes AE2 within another opening OP of the pixel defining layer PDL, and the third light emitting layer EML3 may be positioned only on the (1-3)-th electrodes AE3 within another opening OP of the pixel defining layer PDL. Each of the first light emitting layer EML1, the second light emitting layer EML2, and the third light emitting layer EML3 may be supplied to a target area of a corresponding sub-pixel (for example, an upper portion of an area of the first electrode AE exposed by the opening OP of the pixel defining layer PDL) by an inkjet printing method or the like, but the disclosure is not limited thereto.

Each of the first, second, and third light emitting layers EML1, EML2, and EML3 may have a multi-layered thin film structure including a light generation layer that generates light. In an embodiment, the first light emitting layer EML1 may generate and emit red light, the second light emitting layer EML2 may generate and emit green light, and the third light emitting layer EML3 may generate and emit blue light, but the disclosure is not limited thereto.

The second electrode CE may be disposed on the first light emitting layer EML1, the second light emitting layer EML2, the third light emitting layer EML3, and the pixel defining layer PDL.

The second electrode CE may be a common layer commonly provided to the first, second, and third sub-pixels SPX1, SPX2, and SPX3. The second electrode CE may be provided in a form of a plate throughout an entire area of the display area DA. In another embodiment, the second electrode CE may be patterned and disposed in each of the first, second, and third sub-pixels SPX1, SPX2, and SPX3.

The second electrode CE may be a thin metal layer having a thickness sufficient to transmit light emitted from each of the first, second, and third light emitting layers EML1, EML2, and EML3. The second electrode CE may be made of a metallic material or a transparent conductive material and may have a relatively thin thickness. For example, the second electrode CE may be made of various transparent conductive materials. For example, the second electrode CE may include at least one of various transparent conductive materials including an indium tin oxide, an indium zinc oxide, an indium tin zinc oxide, an aluminum zinc oxide, a gallium zinc oxide, a zinc tin oxide, a gallium tin oxide, and the like, and may be substantially transparent or translucent to satisfy a light transmittance (e.g., a predetermined or selectable light transmittance). Accordingly, the light emitted from each of the first, second, and third light emitting layers EML1, EML2, and EML3 positioned below the second electrode CE may pass through the second electrode CE to be emitted in the upper direction of the encapsulation layer TFE.

The second electrode CE may be electrically connected to the first additional conductive pattern ACP1 through a corresponding second contact portion CNT2, and may electrically connected to the second vertical power wire PL2*a* through the first additional conductive pattern ACP1.

The encapsulation layer TFE may be entirely provided and/or formed on the second electrode CE.

The encapsulation layer TFE may include first, second, and third encapsulation layers ENC1, ENC2, and ENC3 sequentially positioned on the second electrode CE. The first encapsulation layer ENC1 may be positioned on the display element layer DPL (or the second electrode CE) in at least a portion of the display area DA and the non-display area NDA. The second encapsulation layer ENC2 may be positioned on the first encapsulation layer ENC1 in at least a portion of the display area DA and the non-display area NDA. The third encapsulation layer ENC3 may be positioned on the second encapsulation layer ENC2 in at least a portion of the display area DA and the non-display area NDA. In an embodiment, the third encapsulation layer ENC3 may be disposed to entirely overlap the display area DA and the non-display area NDA in a plan view.

Each of the first and third encapsulation layers ENC1 and ENC3 may be formed of an inorganic film including an inorganic material, and the second encapsulation layer ENC2 may be formed of an organic film including an organic material. The inorganic film may include, for example, a silicon nitride ($SiN_x$), a silicon oxide ($SiO_x$), or a silicon oxynitride ($SiO_xN_y$), or the like. The organic film may include an organic insulating material such as a polyacrylates resin, an epoxy resin, a phenolic resin, a polyamides resin, a polyimides rein, an unsaturated polyesters resin, a poly phenylenethers resin, a polyphenylenesulfides resin, benzocyclobutene (BCB), or the like.

In an embodiment, a color filter layer and/or a color conversion layer for emitting light emitted from the first to third light emitting elements LD1, LD2, and LD3 as light having excellent color reproducibility may be selectively provided and/or formed on the encapsulation layer TFE.

Figure 10:
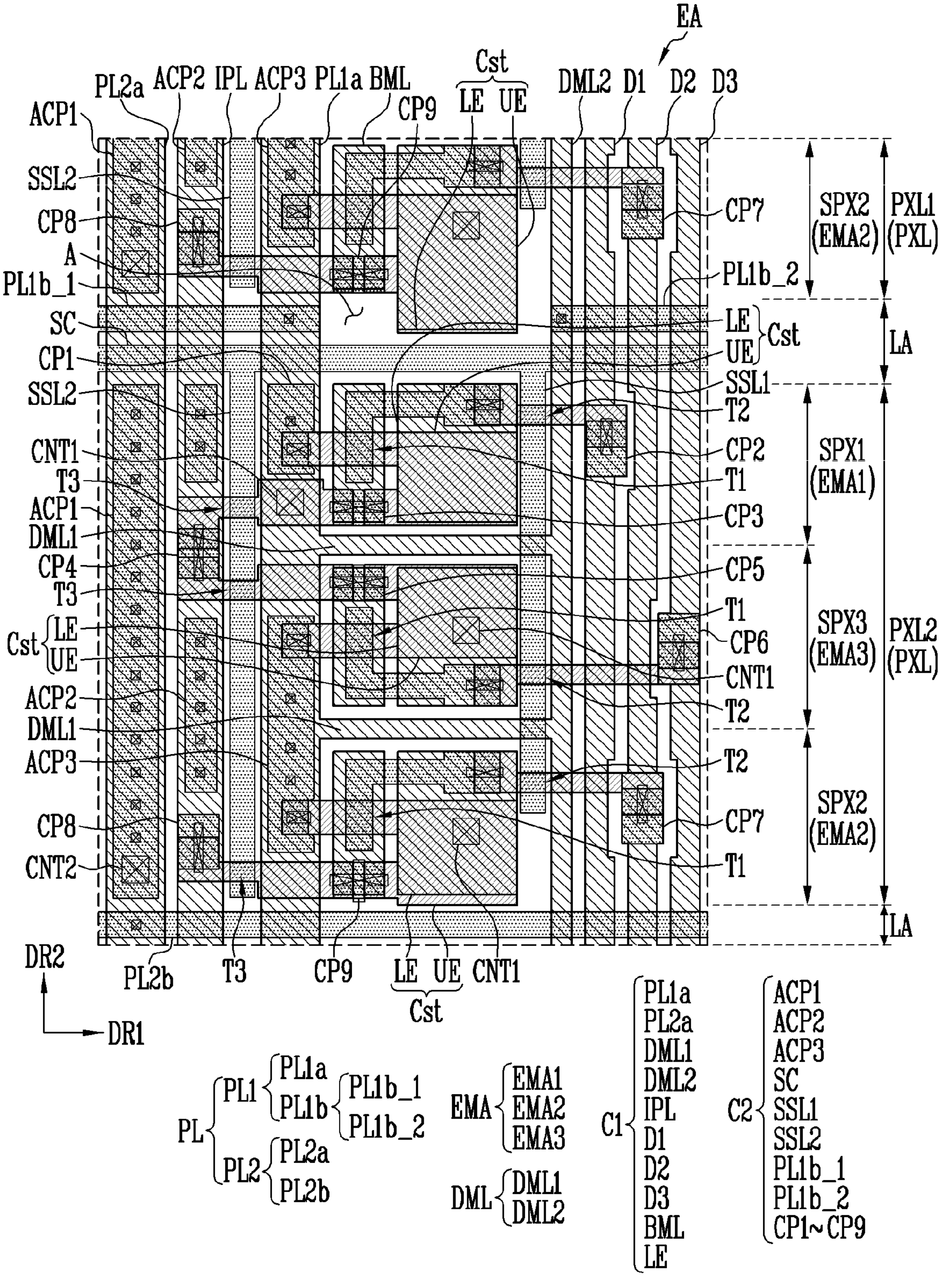
FIG. 10 is a schematic enlarged view of portion EA of the display device of FIG. 1 according to an embodiment.
Figure 11:
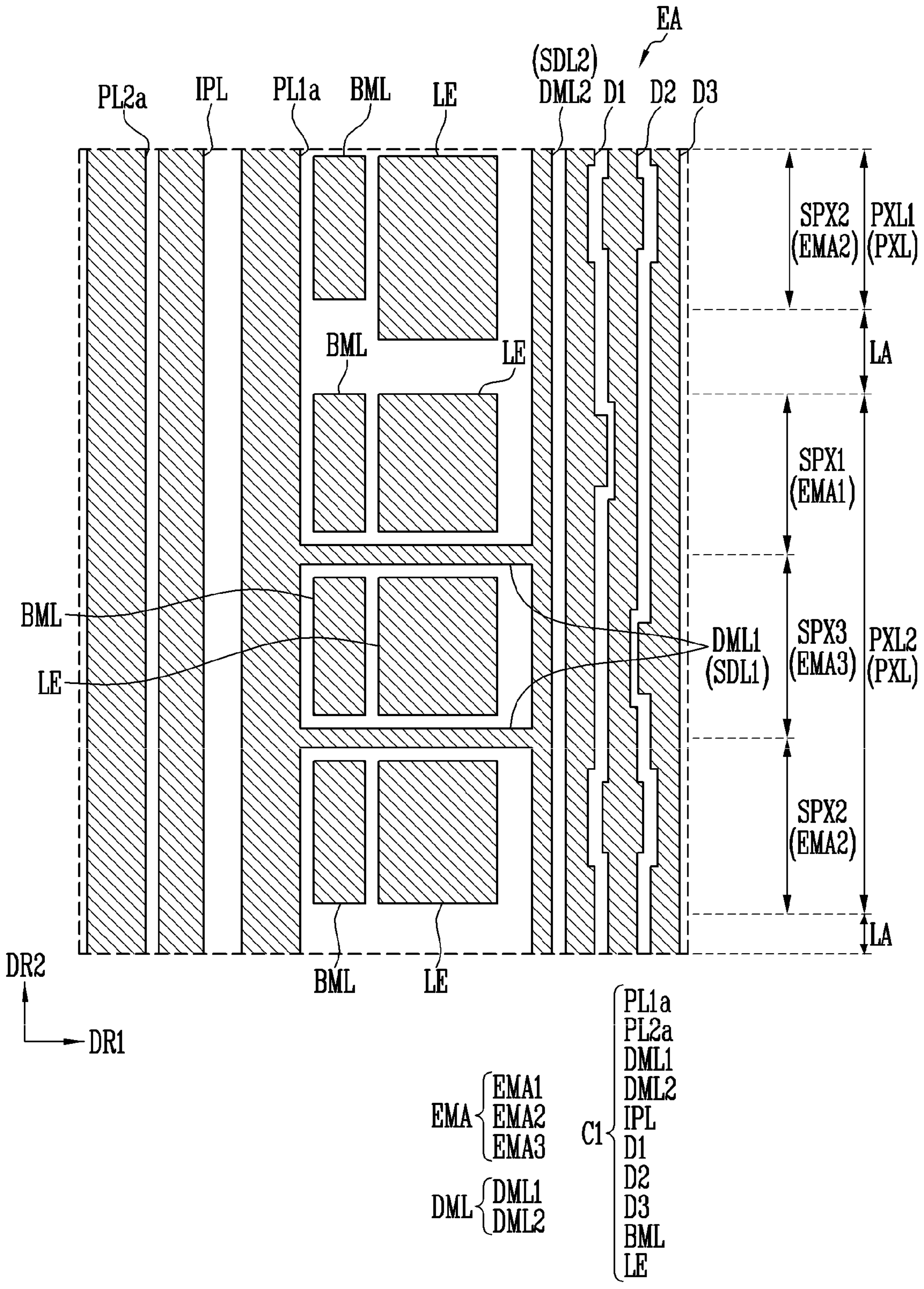
FIG. 11 is a schematic plan view of only components included in a first conductive layer in first and second pixels of FIG. 10.

FIG. 10 is a schematic enlarged view of portion EA of the display device of FIG. 1 according to an embodiment, and FIG. 11 is a schematic plan view of only components included in the first conductive layer C1 in the first and second pixels PXL1 and PXL2 of FIG. 10.

The embodiment of FIG. 10 is different from the embodiment of FIG. 4 in the first horizontal power wire PL1*b*.

In relation to the embodiment of FIG. 10, in order to avoid redundant descriptions, differences from the embodiment described above will be described.

Referring to FIG. 1 to FIG. 3, FIG. 10, and FIG. 11, the display area DA may include a wire area LA in which signal wires extending in the first direction DR1 are disposed.

In a wire area LA positioned between the first pixel PXL1 and the second pixel PXL2, the first horizontal power wire PL1*b* and the scan wire SC may be disposed.

In an embodiment, the first horizontal power wire PL1*b* may include a first sub-wire PL1*b*_1 and a second sub-wire PL1*b*_2 that are spaced apart from each other in the first direction DR1. The first sub-wire PL1*b*_1 and the second sub-wire PL1*b*_2 may be spaced apart from each other with the storage capacitor Cst of the second sub-pixel SPX2 of the first pixel PXL1 between the first sub-wire PL1*b*_1 and the second sub-wire PL1*b*_2.

The first sub-wire PL1*b*_1 and the second sub-wire PL1*b*_2 may be configured of the second conductive layer C2 disposed on the second insulating layer (see, e.g., "INS2" in FIG. 7).

The first sub-wire PL1*b*_1 may be electrically connected to the first vertical power wire PL1*a* configured of the first conductive layer C1 through a corresponding contact hole. The second sub-wire PL1*b*_2 may be electrically connected to the second dummy wire DML2 configured of the first conductive layer C1 through a corresponding contact hole. The second dummy wire DML2 may be integral with the first vertical power wire PL1*a* and electrically and physically connected to the first vertical power wire PL1*a*. Accordingly, the first sub-wire PL1*b*_1 and the second sub-wire PL1*b*_2 may be electrically connected to each other through the first vertical power wire PL1*a* and the second dummy wire DML2.

The storage capacitor Cst of the second sub-pixel SPX2 of the first pixel PXL1 may be provided in an extended form in an area A between the first sub-wire PL1*b*_1 and the second sub-wire PL1*b*_2. For example, the lower electrode LE and the upper electrode UE configuring the storage capacitor Cst may extend to the area A between the first sub-wire PL1*b*_1 and the second sub-wire PL1*b*_2. Accordingly, an overlapping area between the lower electrode LE and the upper electrode UE may be further secured, and a capacitance of the storage capacitor Cst may be increased.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a pixel including a first sub-pixel, a second sub-pixel, and a third sub-pixel, each including a storage capacitor and disposed adjacent to each other;
a data wire electrically connected to the first to third sub-pixels;
a first power wire supplying a voltage of a first driving power source to the first to third sub-pixels; and
a dummy wire disposed to be spaced apart from the first power wire, wherein
the dummy wire includes:
a first dummy wire disposed between the storage capacitor of one of the first to third sub-pixels and the storage capacitor of an adjacent one of the first to third sub-pixels; and
a second dummy wire disposed between the data wire and the storage capacitor of each of the first to third sub-pixels,
the first power wire, the first dummy wire, and the second dummy wire are electrically connected to each other, and
wherein the first power wire includes:
a first vertical power wire configured of a first conductive layer disposed on the substrate; and
a first horizontal power wire configured of a second conductive layer disposed on the second insulating layer,
the first vertical power wire, the first dummy wire, and the second dummy wire are disposed on a same layer.

2. The display device of claim 1, further comprising:
a first insulating layer, a second insulating layer, a third insulating layer, and a fourth insulating layer sequentially disposed on a substrate, wherein
the first horizontal power wire extends in a first direction,
the first vertical power wire extends in a second direction intersecting the first direction, and
the first vertical power wire and the first horizontal power wire are electrically connected to each other.

3. The display device of claim 2, wherein
the first dummy wire and the second dummy wire are configured of the first conductive layer.

4. The display device of claim 3, wherein the first vertical power wire, the first dummy wire, and the second dummy wire are integral with each other.

5. The display device of claim 4, wherein in a plan view, the first dummy wire extends from the first vertical power wire in the first direction and connected to the second dummy wire, and in a plan view, the second dummy wire faces the first vertical power wire with the first dummy wire between the first vertical power wire and the second dummy wire.

6. The display device of claim 5, wherein the first vertical power wire, the first dummy wire, the second dummy wire are connected to each other and form a mesh shape in a plan view.

7. The display device of claim 4, wherein the dummy wire is supplied with the voltage of the first driving power source.

8. The display device of claim 4, wherein the first dummy wire is disposed between the storage capacitor of the first sub-pixel and the storage capacitor of the third sub-pixel, and between the storage capacitor of the third sub-pixel and the storage capacitor of the second sub-pixel.

9. The display device of claim 4, further comprising:

a scan wire configured of the second conductive layer, extending in the first direction, and electrically connected to the first to third sub-pixels, wherein the scan wire includes a sub-scan wire branched in the second direction, and in a plan view, the sub-scan wire is disposed between the second dummy wire and the storage capacitor of each of the first to third sub-pixels.

10. The display device of claim 9, wherein the second dummy wire is disposed between the sub-scan wire and the data wire.

11. The display device of claim 4, wherein each of the first to third sub-pixels includes:

a pixel circuit layer including a first transistor, a second transistor, and a third transistor, and the storage capacitor electrically connected to the first to third transistors; and a display element layer disposed on the pixel circuit layer, electrically connected to the storage capacitor, and including a light emitting element emitting light.

12. The display device of claim 11, wherein each of the first to third transistors includes:

an active pattern disposed on the first insulating layer;

a gate electrode configured of the second conductive layer and overlapping the active pattern in a plan view;

a source electrode connected to an end of the active pattern; and a drain electrode connected to another end of the active pattern.

13. The display device of claim 11, wherein the light emitting element includes:

a first electrode disposed on the pixel circuit layer;

a light emitting layer disposed on the first electrode; and a second electrode disposed on the light emitting layer.

14. The display device of claim 13, wherein the first electrode is configured of a third conductive layer disposed on the fourth insulating layer, and is electrically connected to the storage capacitor through a contact portion penetrating the fourth insulating layer, the third insulating layer, and the second insulating layer.

15. The display device of claim 14, wherein the storage capacitor includes:

a lower electrode configured of the first conductive layer; and an upper electrode disposed on the lower electrode with the first insulating layer between the lower electrode and the upper electrode, and the first electrode is electrically connected to the upper electrode through the contact portion.

16. The display device of claim 2, further comprising:

a second power wire supplying a voltage of a second driving power source different from the first driving power source to the first to third sub-pixels, wherein the second power wire includes:

a second vertical power wire configured of the first conductive layer; and a second horizontal power wire configured of the second conductive layer, and the second vertical power wire and the second horizontal power wire are electrically connected to each other.

17. The display device of claim 2, wherein the first horizontal power wire includes a first sub-wire and a second sub-wire spaced apart from each other in the first direction, and the first sub-wire is electrically connected to the first vertical power wire, and the second sub-wire is electrically connected to the second dummy wire.

18. The display device of claim 17, wherein the storage capacitor of another pixel disposed adjacent to the pixel in the second direction extends to an area between the first sub-wire and the second sub-wire.

19. A display device comprising:

pixels disposed on a substrate, wherein each of the pixels includes:

a first sub-pixel, a third sub-pixel, and a second sub-pixel arranged in a vertical direction intersecting a horizontal direction in a plan view, each of the first sub-pixel, the third sub-pixel and the second sub-pixel including a storage capacitor and arranged in a vertical direction in the plan view;

a first data wire extending in the vertical direction and electrically connected to the first sub-pixel;

a second data wire extending in the vertical direction, electrically connected to the second sub-pixel, and spaced apart from the first data wire in the horizontal direction in the plan view;

a third data wire electrically connected to the third sub-pixel and spaced apart from the second data wire in the horizontal direction;

a first power wire supplying a voltage of a first driving power source to the first to third sub-pixels;

a second power wire supplying a voltage of a second driving power source to the first to third sub-pixels;

a first dummy wire extending in the horizontal direction, electrically connected to the first power wire, disposed between the storage capacitor of the first sub-pixel and the storage capacitor of the third sub-pixel in the vertical direction in the plan view, and between the storage capacitor of the third sub-pixel and the storage capacitor of the second sub-pixel in the vertical direction in the plan view; and a second dummy wire extending in the vertical direction, electrically connected to the first power wire, and disposed between the first data wire and the storage capacitor of the first to third sub-pixels in the horizontal direction in the plan view.

20. The display device of claim 19, wherein the first power wire includes:

a first vertical power wire extending in the vertical direction; and a first horizontal power wire extending in the horizontal direction and electrically connected to the first vertical power wire, and the first vertical power wire, the first dummy wire, the second dummy wire are connected to each other and form a mesh shape in the plan view.

* * * * *